United States Patent
Baba et al.

[11] Patent Number: 5,894,394
[45] Date of Patent: Apr. 13, 1999

[54] INTELLIGENT POWER SWITCH AND SWITCHING APPARATUS

[75] Inventors: Akira Baba; Hiroo Yabe, both of Shizuoka, Japan

[73] Assignee: Yazaki Corporation, Tokyo, Japan

[21] Appl. No.: 08/873,915

[22] Filed: Jun. 11, 1997

[30] Foreign Application Priority Data

Jun. 11, 1996 [JP] Japan ............ 8-149623

[51] Int. Cl.[6] .................................. H02H 3/00
[52] U.S. Cl. ............... 361/87; 361/93; 361/100; 361/115
[58] Field of Search ................ 361/87, 93, 100, 361/115, 95

[56] References Cited

U.S. PATENT DOCUMENTS 4,825,330  4/1989  Walchle ............ 361/95
5,272,392  12/1993  Wong et al. ............ 307/270

*Primary Examiner*—Jeffrey Gaffin
*Assistant Examiner*—Stephen Jackson
*Attorney, Agent, or Firm*—Sughrue, Mion, Zinn, Macpeak & Seas, PLLC

[57] ABSTRACT

First threshold corresponding to a large electric current capable of breaking a MOS-FET even if the electric current flows even in a short period is provided for a difference amplifying circuit and second threshold lower than the first threshold is stored in a memory. If a detected electric current value is higher than the first threshold or if a CPU determines that an electric current higher than the second threshold has flowed continuously for a period longer than a predetermined period, the semiconductor switch is switched off.

10 Claims, 12 Drawing Sheets

INTELLIGENT POWER SWITCH AND SWITCHING APPARATUS

BACKGROUND OF THE INVENTION

The present invention relates to an intelligent power switch and a switching apparatus, and more particularly to an intelligent power switch and a switching apparatus for use in an automobile and arranged to selectively supply electric power from a battery to each load.

Hitherto, a multiplicity of switching circuits have been mounted on a vehicle to selectively supply electric power from a battery to each electric units (hereinafter called as "loads") in response to operation of operation switches, such as an ignition key, a light switch, an audio switch and so forth.

FIG. 8 schematically shows the foregoing structure in which a battery 1 is connected to a junction block (J/B) 2. Operation switches SW1, SW2, . . . . . disposed on an operation panel 3 are connected to the junction block 2. The junction block 2 has switching circuits corresponding to the number of the operation switches SW1, SW2, . . . . . Each switching circuit switches on/off the connection between a power supply line from the battery 1 and each electric wire connected to each load in response to the operation of the operation switches SW1, SW2, . . . . .

As a result, the battery power is, through the junction block 2, selectively supplied to each load in response to the operation of the operation switches SW1, SW2, . . . . . When, for example, a head light switch is switched on, the junction block 2 turns on a power supply line from the battery 1 and electric wires connected to the head lights 4A and 4B. Thus, electric power is supplied to the head lights 4A and 4B so that the head lights 4A and 4B are turned on.

In addition to the head lights 4A and 4B which are loads to which electric power is directly supplied through the junction block 2, loads, such as motors 5A and 5B for operating the power windows, are supplied with electric power output from the junction block 2 through switching circuits 6A and 6B. The switching operations of the motors 5A and 5B are controlled by operation switches 7A and 7B.

In actuality, the junction block 2 is structured as shown in FIG. 9. The junction block 2 is provided with a plurality of relays L1, L2, L3, . . . . The foregoing relays L1, L2, L3, . . . . , are classified into relays, such as the relays L1 and L2, to which the head lights 4A and 4B correspond and the switching operations of which are directly controlled by the operation switches SW1 and SW2 so as to directly supply electric currents to the loads; and the relay L3, the switching operation of which is controlled in accordance with the state of the ignition switch 8.

Among the above-mentioned relays, the relays L1 and L2 are supplied with electric power from the battery through a fusible link (FL) 9 and fuses F1 and F2. As a result, if a high electric current higher than an allowable level flows through a power supply line for establishing the connection between the battery 1 and the junction block 2, the fusible link 9 is fused. If an excess current higher than an allowable level flows in an electric wire (a harness) for establishing the junction block 2 and each load, the fuses F1 and F2 are fused. Thus, the overall body of the power supply line can be protected from smoking or firing, and flow of an excess current to a load can be prevented. Similarly, the relay L3 is supplied with battery power from the battery 1 through the fusible link FL9. Moreover, an output terminal of the relay L3 is connected to each of the loads 5A and 5B through the fuses F3 and F4 and the relays L4 and L5.

Since semiconductor switches having improved performance and low cost can easily be obtained because the technology for manufacturing semiconductors has been developed in recent years, a switching circuit using a semiconductor switch has been suggested to be employed in place of the relays L1, L2, L3, . . . . , arranged to be operated by the mechanical contacts.

A switching circuit of the foregoing type is generally provided with a protective function for protecting the semiconductor switch from an excess current and overheat. In a case where an electric current higher than a predetermined level flows in the semiconductor switch or in a case where the semiconductor switch has been heated to a level higher than a predetermined temperature, the semiconductor switch is forcibly switched off so that the semiconductor switch is protected.

FIG. 10 shows an example of a switching circuit using the semiconductor switch of the foregoing type. A switching circuit 11 is connected to the positions of each of the relays L1, L2, . . . . , in place of each of the relays L1, L2, . . . . . In an example case where the switching circuit 11 is connected in place of the relay L1, a fuse F1 (see FIG. 9) is connected to a power supply terminal 12. A load 4A is connected to an output terminal 13. Moreover, an operation switch SW1 is connected to a control signal input terminal 14. In the case of the switching circuit 11, a control voltage generating portion (not shown) arranged to supply control voltage of, for example 5 [V], supplied from the operation switch SW1 to the control signal input terminal 14 as a switch-on control signal when the operation switch SW1 is switched on and to inhibit supply of the control voltage when the operation switch SW1 is switched off, is actually disposed between the operation switch SW1 and the control signal input terminal 14.

The switching circuit 11 is composed of an n-channel power MOS-FET 15 (hereinafter simply called as a "MOS-FET 15") serving as a main semiconductor switch and a protective circuit 16 for protecting the MOS-FET 15 from an excess current and overheat. The protective circuit 6 forcibly turns the MOS-FET 15 off when the level of the electric current which flows in the MOS-FET 15 or heat generated from the MOS-FET 15 exceeds a predetermined value so as to protect the MOS-FET 15. Note that the switching circuit 11 is structured by one chip.

When a control signal for instructing to switch the switching circuit 11 on is actually supplied from the control signal input terminal 14 (that is, when, for example, voltage of 5 [V] is applied to the control signal input terminal 14 as control voltage $V_{IN}$), input S of the RS flip-flop 17 is made to be "High" and output Q is made to be "High". Thus, the FET 18 is turned on. As a result, voltage sufficiently high to turn on the MOS-FET 15 is applied to the gate of the MOS-FET 15 so that the MOS-FET 15 is turned on.

Since an excess current flows in the MOS-FET 15 in a case where a load (not shown) connected to the output terminal 13 through an electric wire is short-circuited due to a failure or the like in the above-mentioned on-condition, or in a case where the power supply voltage VB is raised to an excess level, there arises a risk that the MOS-FET 15 may be damaged. Also in a case where the MOS-FET 15 is heated excessively, there arises a risk that the MOS-FET 15 may be broken owning to heat.

Therefore, the switching circuit 11 is structured such that comparators 20 and 21 monitor whether or not the level of the electric current which flows in the MOS-FET 15 and the temperature of the MOS-FET 15 are higher than predetermined levels to forcibly turn the MOS-FET 15 off if the levels are higher than the predetermined levels so as to prevent damage of the MOS-FET 15.

Specifically, source voltage (a voltage level converted by resistor R1 to be in proportion to a source electric current) of the MOS-FET 15 is supplied to a non-inverted input terminal of the comparator 20, while reference voltage Vref generated by a bias generating circuit 22 is supplied to an inversion input terminal. If the source voltage is higher than the reference voltage Vref, positive logic is output.

Voltage level $V_T$ in proportion to the temperature is supplied from a temperature sensor (not shown), disposed adjacent to the MOS-FET 15, to a non-inverted input terminal of the comparator 21, while the reference voltage Vref is supplied to the inverted input terminal of the same. If the temperature voltage $V_T$ is higher than the reference voltage Vref, positive logic is output. Thus, if an excess current flows in the MOS-FET 15 or if the MOS-FET 15 is overheated, a logical summation circuit 23 outputs a logical value of positive logic.

At this time, since the flip-flop 17 is supplied with the positive logic signal from the logical summation circuit 23 to the input R thereof, it outputs negative logic as output Q and positive logic as inverted output Q. As a result, the FET 18 is turned off and the FET 19 is turned on so that the gate of the MOS-FET 15 is not supplied with the control voltage $V_{IN}$. Thus, the MOS-FET 15 is turned off. If excess voltage is supplied, the level of power supply voltage $V_B$ is lowered through a zener diode 24A and a diode 24B, and then the power supply voltage $V_B$ is applied to the gate of the MOS-FET 15. Thus, the electric current is allowed to pass through the gate of the MOS-FET 15, and then allowed to flow into the source.

A zener diode 15A provided for the MOS-FET 15 is a parasitic diode of the MOS-FET 15, and a zener diode 25 disposed between the control signal input terminal 14 and the output terminal 13 is arranged to bypass the control signal voltage $V_{IN}$ if it has been raised to a level higher than a predetermined level.

As a switching circuit using a semiconductor switch, a switching circuit called as "IPS (Intelligent Power Switch)" formed as shown in FIG. 11 has been suggested. The switching circuit 30 has an abnormal-signal output portion 41 for indicating abnormality of the switching circuit 30 in accordance with the output voltage level VOUT from the semiconductor switch.

The abnormal-signal output portion 41 is, as shown in FIG. 8, connected to the abnormal display portion 43 through a CPU (Central Processing Unit) 42 so as to detect forcible switching off of the semiconductor switch 32 because of the protective function of the switching circuit 30, which is operated if excessively high voltage is applied to the semiconductor switch 32 of the switching circuit 30, an excess current flows through the same or the same is overheated, so as to transmit an abnormal signal to the CPU 42. In accordance with the abnormal signal, the CPU 42 detects the switching circuit 30 which has encountered the abnormality, and then causes an abnormal display portion 43 to display a result of the detection.

The structure of the switching circuit 30 having the structure composed of the intelligent power switch will now be described. The switching circuit 30 has a structure similar to that of the switching circuit 11 shown in FIG. 10 except that the switching circuit 30 has the abnormal-signal output portion 41. The switching circuit 30 supplies the power supply voltage VB to the πMOS-FET 32 through the power supply terminal 12 connected to the fusible link 9 (see FIG. 9) and turns on/off the πMOS-FET 32 by a driver 33 thereof.

The switching circuit 30 is provided with an excess voltage detection circuit 34 for detecting a fact that the power supply voltage VB has an excessive voltage level, an electric current detection circuit 35 for detecting an excess current by subjecting the voltage level obtained in accordance with the level of an electric current which flows between the drain and the source of the πMOS-FET 32 and reference voltage Vref supplied from the reference-voltage generating circuit 33A to a comparison so as to detect an excess current, and a temperature detection circuit 36 for detecting overheat of the πMOS-FET 32 by subjecting temperature voltage level $V_T$ obtained from a temperature sensor (not shown) disposed adjacent to the πMOS-FET 32 and the reference voltage Vref to a comparison. Results of detection performed by the detection circuits 34, 35 and 36 are supplied to a negative OR circuit 37. The negative OR circuit 37 is supplied with the control voltage $V_{IN}$ through an inverter 38.

An output from the negative OR circuit 37 is supplied to the driver 33 and a charge pump 39. The charge pump 39 is operated only when the output from the negative OR circuit 37 is positive logic so as to raise the level of power supply voltage $V_{DD}$ stabilized by a regulator 40 so as to supply the power supply voltage $V_{DD}$ to the driver 33. In a case where the output from the negative OR circuit 37 is positive logic, the driver 33 supplies, to the gate of the πMOS-FET 32, control voltage, the level of which turns the πMOS-FET 32 on, and in a case where the output from the negative OR circuit 37 is negative logic, the driver 33 supplies, to the gate of the πMOS-FET 32, control voltage, the level of which turns the πMOS-FET 32 off.

Thus, in the switching circuit 30, similarly to the foregoing switching circuit 11, in a case where excessively high voltage is applied to the πMOS-FET 32, an excess current flows in the πMOS-FET 32 or the πMOS-FET 22 is overheated in a state where the control voltage $V_{IN}$ is positive logic, the switching operation of the πMOS-FET 32 can be controlled to be switched off. As a result, damage of the πMOS-FET 32 can be prevented.

The switching circuit 30 supplies output voltage $V_{OUT}$ to the abnormal-signal output portion 41 through an inverter 44. The abnormal-signal output portion 41 has an n-channel MOS-FET 41A. The MOS-FET 41A is turned off when the πMOS-FET 32 has been turned on and thus the level of the output voltage VOUT has been raised. On the other hand, the MOS-FET 41A is turned on when the πMOS-FET 32 has been turned off and thus the level of the output voltage $V_{OUT}$ has been lowered. A drain terminal 41B of the MOS-FET 41A is pulled up.

Therefore, the CPU 42 (see FIG. 8) is able to determine that the protective function is not operated (that is, no abnormality) in the switching circuit 30 when no potential difference takes place between the drain terminal 41B of the MOS-FET 41A and the source terminal 41C of the same. If a potential difference takes place between the drain terminal 41B and the source terminal 41C, the CPU 42 is able to determine that the protective function is operated (that is, abnormality takes place) in the switching circuit 30.

In each of the foregoing conventional switching circuits 11 and 30 having the protective function, even if a rush current flows when electric power has been supplied to the load, the excess current protective function for protecting the semiconductor switches 15 and 32 is operated. Therefore, there arises a problem in that electric power cannot be supplied to the load when the electric power is supplied.

The foregoing problem will now be described with reference to FIG. 12. FIG. 12 shows change in the electric current level in a semiconductor switch having a rated electric current level of about 10 |A|. In a case where a semiconductor switch of the foregoing type is employed, excess current detection threshold Th is, in general, set to about 20 |A| (that is, the reference voltage Vref of each of the comparator 20 and the electric current detection circuit 35 is set to a value corresponding to the electric current value of 20 |A|). If an electric current, the level of which is higher than the excess current detection threshold Th, flows, the semiconductor switch is switched off.

As a result, the semiconductor switch can be protected from an excess current generated owing to falling of a load, rare short or the like. However, as can be understood from the drawing, at times the rush current will be higher than the excess current detection threshold Th. Therefore, the semiconductor switch is unintentionally switched off when rush current flows.

The semiconductor switch having the rated current level of about 10 |A| has a risk that the semiconductor switch is damaged if an electric current of about 20 |A| or higher flows continuously attributable to falling of a load or rare short. In general, no damage will occur if the flow takes place in a very short time or if an electric current lower than 80 |A| flows. The rush current generally flows for only a short period of time of about one second. Moreover, the level usually is not higher than 80 |A|. Therefore, it is unlikely that the semiconductor switch will be damaged by the rush current. As a result, it can be considered that the structure in which the semiconductor switch is switched off by the rush current is not necessary in view of protecting the semiconductor switch.

SUMMARY OF THE INVENTION

In view of the foregoing, an object of the present invention is to provide an intelligent power switch and a switching apparatus capable of preventing the unnecessary switching off of the semiconductor switch by a rush current and capable of satisfactorily protecting the semiconductor switch.

In order to achieve the foregoing object, an intelligent power switch according to a first aspect of the present invention comprises a semiconductor switch arranged to be switched on in response to input of a control signal to a control signal input terminal to supply electric power from a power source to a load connected to an output terminal; excess current protective means for protecting the semiconductor switch from an excess current by outputting a signal to the control signal input terminal of the semiconductor switch to switch the semiconductor switch off in a case where the excess current has flowed in the semiconductor switch; electric current detection means for detecting an electric current which flows in the semiconductor switch 61; and external output means for outputting an electric current level detected by the electric current detection means 67.

With the above-mentioned structure, by monitoring the detected electric current level output from the external output means, whether, for example, a rush current flows in the semiconductor switch or an excess current flows attributable to short circuit can easily be determined.

A switching apparatus according to a second aspect comprises an intelligent power switch according to the first aspect; control means connected to the external output means and arranged to monitor the electric current detected by the electric current detection means and to output a signal to the control signal input terminal of the semiconductor switch so as to switch the semiconductor switch off when a result of monitoring is obtained which indicates a fact that an abnormal electric current has flowed in the semiconductor switch; and data storage means having threshold data stored therein with which the control means determines whether or not an abnormal electric current has flowed.

In the above-mentioned structure, the control means monitors an electric current which flows in the semiconductor switch and compares it to threshold data in the data storage means to determine whether or not an abnormal electric current flowed in the semiconductor switch so as to switch on/off the semiconductor switch. Since whether or not the electric current flowing in the semiconductor switch is an abnormal electric current can easily be determined, the semiconductor switch can appropriately be switched off when it must be switched off.

A switching apparatus according to a third aspect has a structure such that the excess current protective means has one input terminal for receiving a voltage level corresponding to the level of an electric current which flows in the semiconductor switch and another input terminal for receiving a reference voltage level corresponding to an electric current level destructive to the semiconductor switch in a case where the electric current flows in the semiconductor switch even in a short period of time. In this third embodiment, the excess current protective means is arranged to output a signal to the control signal input terminal of the semiconductor switch from an output terminal thereof when the voltage level corresponding to the electric current which flows in the semiconductor switch has exceeded the reference voltage level so as to switch the semiconductor switch off. In this embodiment, the data storage means has an electric current level stored therein as threshold data which is lower than the electric current level destructive to the semiconductor switch in a case where the electric current flows in the same even in a short period of time, and the control means outputs a signal to the control signal input terminal of the semiconductor switch so as to switch the semiconductor switch off in a case where an electric current higher than threshold data continuously flows in the semiconductor switch for a period of time longer than a predetermined period of time.

In the above-mentioned structure, the excess current protective means does not switch the semiconductor switch off even if a low level electric current similar to the rush current flows. Only when a rapid and high electric current with which the semiconductor switch can be damaged in a short period of time flows in the semiconductor switch, the excess current protective means switches the semiconductor switch off. On the other hand, the control means switches the semiconductor switch off if an electric current higher than threshold data flows continuously for a period of time longer than a predetermined period time attributable to, for example, short circuit or rare short of the load because the semiconductor switch may be damaged. As a result, the switching apparatus is able to perform control such that the semiconductor switch is not switched off when a rush current flows and the semiconductor switch is switched off if an abnormal electric current capable of damaging the semiconductor switch 61 flows.

A switching apparatus according to a fourth aspect has a structure such that the data storage means has threshold data stored therein and determined in consideration of fuming characteristics of an electric wire for establishing the connection between the semiconductor switch and the load, and the control means monitors a current-time product of the detected electric current and subjects the current-time product and threshold data to a comparison so as to switch the semiconductor switch off when the current-time product exceeds threshold data AR1.

In the above-mentioned structure, the control means detects flowing of an abnormal electric current, which would cause fuming of the electric wire, by comparing the current-time product of the detected electric current to the threshold data stored in the data storage means. If an abnormal electric current flows, the control means switches the semiconductor switch off.

A switching apparatus according to a fifth aspect has a structure such that the excess current protective means has one input terminal for receiving a voltage level corresponding to level of an electric current which flows in the semiconductor switch and another input terminal for receiving a reference voltage level corresponding to an electric current level destructive to the semiconductor switch in a case where the electric current flows in the semiconductor switch even in a short period of time, the excess current protective means being arranged to output a signal to the control signal input terminal of the semiconductor switch from an output terminal thereof when the voltage level corresponding to the electric current which flows in the semiconductor switch has exceeded the reference-voltage level so as to switch the semiconductor switch off. The data storage means has an electric current level stored therein as first threshold data which is lower than the electric current level destructive to the semiconductor switch in a case where the electric current flows in the same even in a short period of time and second threshold data stored therein which is determined in consideration of fuming characteristics of an electric wire for establishing the connection between the semiconductor switch and the load. The control means switches the semiconductor switch off in a case where an electric current higher than first threshold data has continuously flowed in the semiconductor switch for a period of time longer than a predetermined period of time or in a case where a current-time product of the detected electric current in a predetermined period of time is larger than second threshold data.

In the above-mentioned structure, the excess current protective means switches the semiconductor switch off only when a rapid and high electric current flows in the semiconductor switch. The control means switches the semiconductor switch off in a case where an electric current higher than threshold data flows continuously for a period of time longer than a predetermined period of time because the semiconductor switch may be damaged. Moreover, the control means switches the semiconductor switch off if the current-time product in a predetermined period of time is larger than the threshold because the electric wire fumes in this case.

A switching apparatus according to a sixth aspect has a structure such that the data storage means has threshold data stored therein which is smaller than the fuming characteristics of an electric wire for establishing the connection between the semiconductor switch and the load and larger than an operation enabling characteristic of the load, and the control means switches the semiconductor switch off when a current-time product of the detected electric current is larger than threshold data.

In the above-mentioned structure, the control means is able to switch the semiconductor switch on in an electric current range in which the operation of the load can satisfactorily be performed and fuming of the electric wire can reliably be prevented.

An intelligent power switch according to a seventh aspect is further provided with overheat protective means for outputting a signal to the control signal input terminal of the semiconductor switch to switch the semiconductor switch off so as to protect the semiconductor switch from overheat when the temperature of the semiconductor switch has been raised to be higher than a predetermined level.

A switching apparatus according to an eighth aspect is further provided with overheat protective means for outputting a signal to the control signal input terminal of the semiconductor switch to switch the semiconductor switch off so as to protect the semiconductor switch from overheat when the temperature of the semiconductor switch has been raised to be higher than a predetermined level.

DETAILED DESCRIPTION OF THE INVENTION

Preferred embodiments of the present invention will now be described with reference to the drawings.

(1) Schematic Structure of Switching Apparatus

Figure 1:
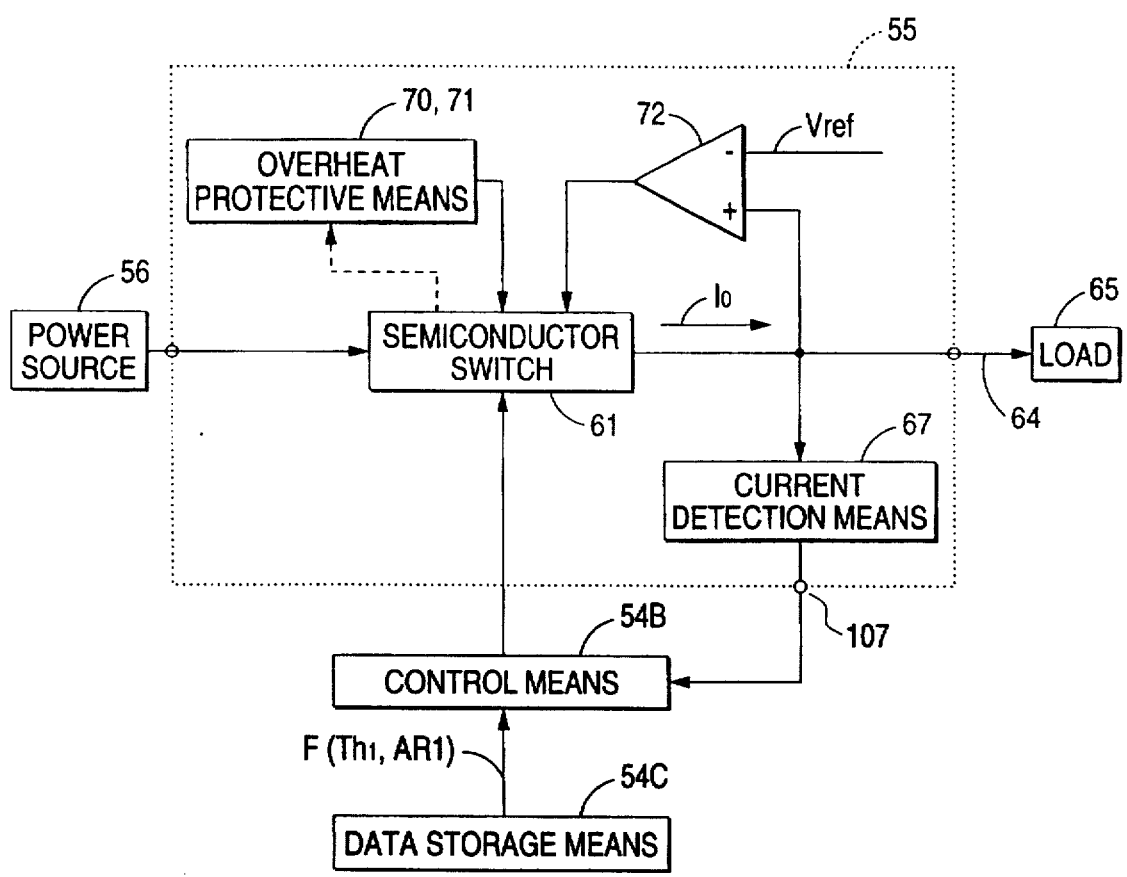
FIG. 1 is a block diagram showing the basic structure of an intelligent power switch and a switching apparatus according to the present invention.
Figure 2:
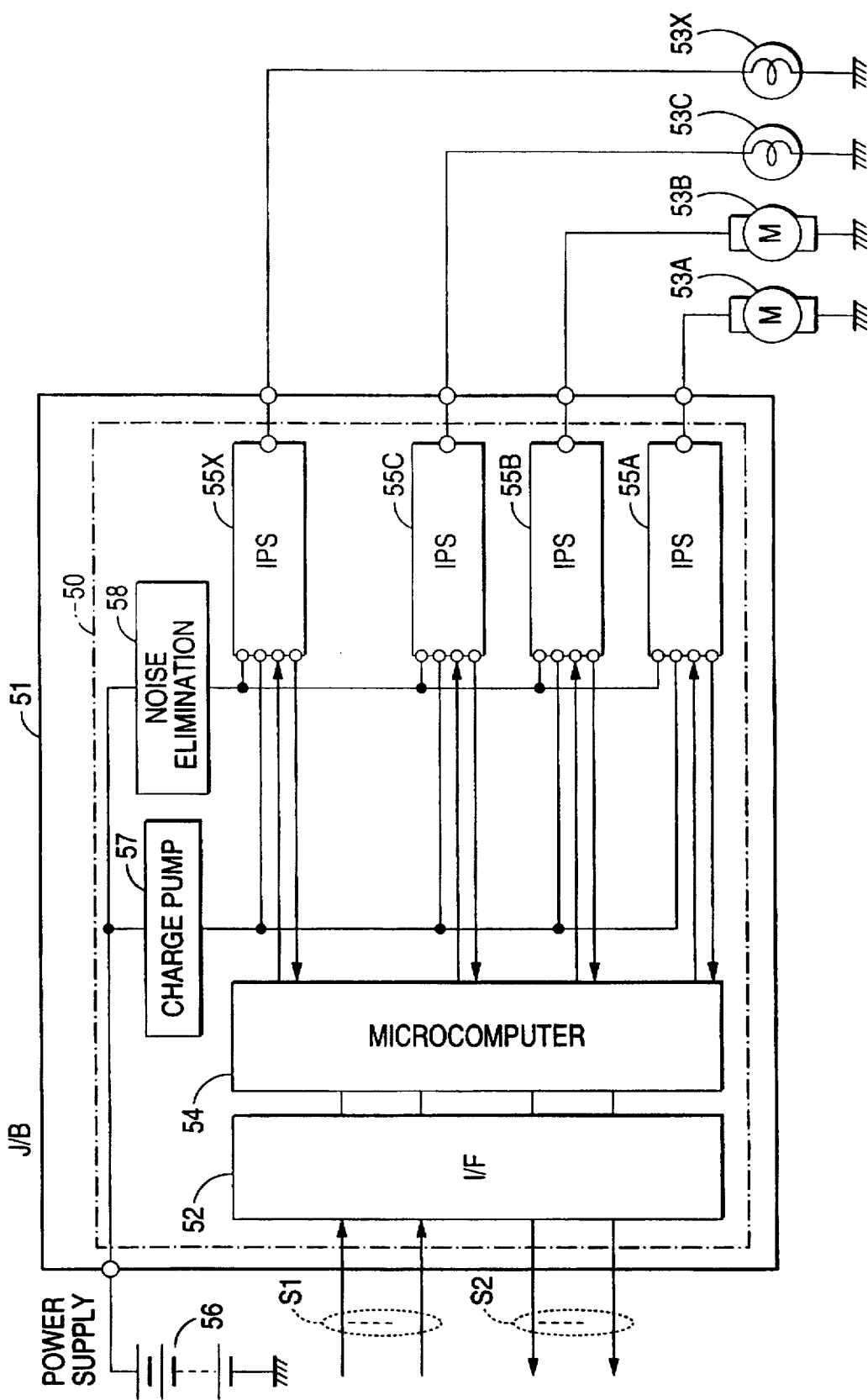
FIG. 2 is a block diagram showing the overall structure of the switching apparatus according to the present invention.

FIG. 2 shows a structure in which the schematic structure of a switching apparatus 50 according to the present invention is applied to a junction block (J/B) 51. Switching control signal S1 is supplied to the interface (I/F) 52 of the switching apparatus 50 from each of operation switches (not shown) corresponding to loads 53A, 53B, 53C, . . . . . 53X so as to be supplied to a microcomputer 54. The switching apparatus 50 is provided with IPS (intelligent power switches) 55A, 55B, 55C, . . . . . 55X corresponding to the loads 53A, 53B, 53C, . . . . . 53X. The microcomputer 54 transmits the switching control signal S1 (hereinafter simply called as a "control signal S1") from each of operation switches corresponding to the loads 53A, 53B, 53C, ..., 53X to the corresponding IPS 55A, 55B, 55C, ..., 55X. Thus, the switching operation of each of the IPS 55A, 55B, 55C, ..., 55X is controlled in response to the switching operation of the operation switch. As a result, electric power of the battery 56 is selectively supplied to each of the loads 53A, 53B, 53C, ..., 53X.

In addition to the foregoing structure, the IPS 55A, 55B, 55C, ..., 55X detect the amount of electric current which flows in the semiconductor switch to transmit a result of the detection to the microcomputer 54, as described later. In accordance with the result of the detection, the microcomputer 54 monitors the characteristics of the electric current which flows in the semiconductor switch including the time factor. If flow of an abnormal electric current in the semiconductor switch is detected, a control signal for switching the semiconductor switch off is transmitted to the IPS 55A, 55B, 55C, ..., 55X.

In this embodiment, if the microcomputer 54 determines that the semiconductor switch may be damaged because an electric current higher than a predetermined level has flowed continuously for a time of period longer than a predetermined time of period, or if an electric current near the fuming characteristic of an electric wire for establishing the connection between the IPS 55A, 55B, 55C, ..., 55X and the loads 53A, 53B, 53C, ..., 53X flows, the microcomputer 54 switches the semiconductor switches IPS 55A, 55B, 55C, ..., 55X off.

As a result, the switching apparatus 50 is structured such that the semiconductor switch is not switched off by the rush current (because the rush current continues for a very short time). Only when an excess current capable of damaging the semiconductor switch flows, the semiconductor switch can effectively be switched off. Moreover, a fuse required in the conventional structure to be provided in front of each of the IPS 55A, 55B, 55C, ..., 55X in order to protect the electric wire can be omitted. When the microcomputer 54 detects that the electric current flowing in the semiconductor switch is an abnormal electric current, it transmits an abnormal signal S2 through the I/F 52 to communicate this to an abnormality display portion (not shown) composed of, for example, an indicator lamp.

The switching apparatus 50 has a structure such that a charge pump 57 for generating drive voltage for operating the semiconductor switches of the IPS 55A, 55B, 55C, ..., 55X is shared by the plurality of the IPS 55A, 55B, 55C, ..., 55X. That is, drive voltage generated by one charge pump 57 is used to drive a plurality of the semiconductor switches. Moreover, a noise eliminating circuit 58 composed of an LC filter is disposed on an electric power line between the charge pump 57 and the IPS 55A, 55B, 55C, ..., 55X. The noise eliminating circuit 58 eliminates noise brought onto the electric power line attributable to the oscillating operation of the charge pump 57.

As a result, in the switching apparatus 50, generation of noise from the charge pump 57 can be minimized. Moreover, noise on the power supply line can be eliminated by one noise eliminating circuit 58. Therefore, the structure can be simplified. Since a conventional switching apparatus of the foregoing type has a charge pump for each semiconductor switch, noise which is generated from the charge pump is intensified excessively. The generated noise is brought onto the power supply line or the signal line, thus adversely affecting the overall apparatus. Since a noise eliminating circuit must be provided for each semiconductor switch, there arises a problem in that the structure becomes too complicated.

Actually, noise generated from the charge pump 57 includes conducted noise and radiated noise. The conducted noise is eliminated by the foregoing noise eliminating circuit 58, while the radiated noise is prevented by covering the charge pump 57 with a metal case.

(2) Detailed Structure of Switching Apparatus (2-1) Structure of IPS

Figure 3:
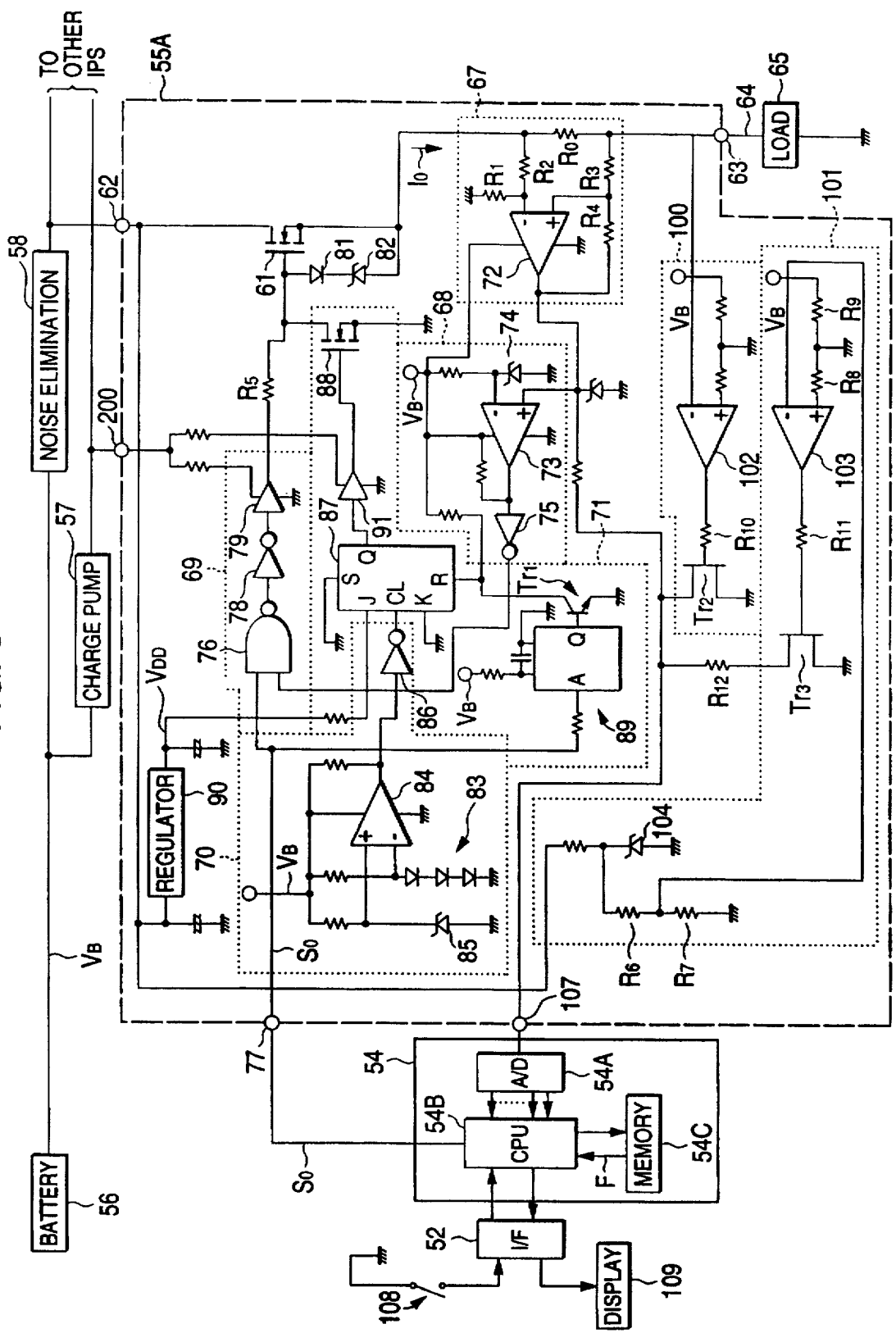
FIG. 3 is a diagram showing the detailed structure of the intelligent power switch and the switching apparatus according to the present invention.

The detailed structure of the switching apparatus 50 will now be described with reference to FIG. 3. Referring to FIG. 3, the structure of the IPS 55A selected from the plurality of the IPS 55A, 55B, 55C, ..., 55X shown in FIG. 2 and the relationship between the IPS 55A and the microcomputer 54 will now be described. Since the IPS 55A and the other IPS 55B, 55C, ..., 55X have similar structures to the structure to be described later and the relationship between the other IPS 55B, 55C, ..., 55X and the microcomputer 54 is the same as the relationship to be described later, only one IPS 55A will now be described and the other IPS 55B, 55C, ..., 55X are omitted from description.

Since the switching operation of the power MOS-FET 61 is controlled by the control voltage supplied to the gate, the IPS 55A is structured to supply power supply voltage $V_B$ applied from the battery 56 to the power supply input terminal 62 through the noise eliminating circuit 58 to the load 65 through the output terminal 63 and the electric wire 64 only when required. The IPS 55A has an excess current protective function and an overheat protective function for protecting the power MOS-FET 61 from an excess current and overheat.

The IPS 55A mainly comprises a power MOS-FET 61 (hereinafter simply called as a "MOS-FET 61") serving as a main semiconductor switch, an electric current detection circuit 67 having a shunt resistor $R_O$ and arranged to detect the level $I_O$ of an electric current which flows in the MOS-FET 61, an excess current detection circuit 68 arranged to subject a voltage level corresponding to an electric current obtained by the electric current detection circuit 67 and a reference voltage level corresponding to an electric current value with which the MOS-FET 61 can be broken if the electric current flows in the MOS-FET 61 only for a short period of time to a comparison to detect whether or not a rapid and large electric current has flowed in the MOS-FET 61, a logical product circuit 69 for supplying a logical product of a result of detection performed by the excess current detection circuit 68 and the control signal So to the gate of the MOS-FET 61 as control voltage to switch on/off the MOS-FET 61, a temperature detection circuit 70 for outputting a logical value corresponding to the temperature of the MOS-FET 69, an overheat preventive circuit 71 for forcibly lowering the gate voltage of the MOS-FET 61 in accordance with a result of detection of the logic performed by the temperature detection circuit 70 so as to switch the MOS-FET 61 off and other circuits.

The electric current detection circuit 67 detects the level Io of an electric current which flows in a shunt resistor Ro in accordance with the voltages at the two ends of the shunt resistor Ro. The shunt resistor Ro is determined such that the resistance value is about 10 [mΩ] and allowable resistance is about ±5 [%]. By using a one-chip structure diffusion resistor or a polysilicon resistor, the electric current can accurately be detected.

The electric current detection circuit 67 supplies the voltage at an end of the shunt resistor Ro to a non-inverted input terminal of the difference amplifying circuit 72 through divided-voltage resistors R1 and R2. Moreover, it supplies the voltage at another end of the shunt resistor Ro to an inverted input terminal of the difference amplifying circuit 72 through input resistor R3. In addition, it establishes the connection between the inverted input terminal and the output terminal of the difference amplifying circuit 72 through resistor R4. Thus, the electric current detection circuit 67 is able to output a voltage level corresponding to output current level Io from the MOS-FET 61.

The excess current detection circuit 68 supplies a detected voltage level supplied from the electric current detection circuit 67 to the non-inverted input terminal of the comparator 73 and supplies, to an inverted input terminal, a reference voltage level generated by the reference voltage generator 74 and corresponding to an electric current level (if the rated electric current for the MOS-FET 61 is, for example, about 10 |A|, it is about 70 |A|) with which the MOS-FET 61 can be broken even if the electric current flows in the MOS-FET 61 only for a short period of time. If the detected voltage level is higher than the reference voltage level, it outputs a positive potential (hereinafter it is called as "positive logic" and zero potential is called as "negative logic"). Then, the excess current detection circuit 68 supplies an output from the comparator 73 to the logical product circuit 69 through the inverter 75. Thus, the excess current detection circuit 68 outputs positive logic if a large electric current flows in the MOS-FET 61. If any large electric current does not flow, it outputs negative logic.

The logical product circuit 69 supplies, to the NAND circuit 76, control signal So through a control signal input terminal 77 and supplies a logic value supplied from the excess current detection circuit 68 so as to obtain a result of NAND. The output from the NAND circuit 76 is supplied to a buffer 79 through an inverter 78. An output from the buffer 79 is supplied to a gate of the MOS-FET 61 through a resistor R5.

If the control signal So is positive logic (in this embodiment, the positive logic is set to be about 5 |V| and the negative logic is set to be about 0 |V|) and an output from the excess current detection circuit 68 is positive logic (indicating a fact that the electric current is a large electric current), the logical product circuit 69 causes the inverter 78 to output a signal of positive logic (which is a voltage level of 5 |V| in this embodiment). If the control signal So is positive logic and the output from the excess current detection circuit 68 is negative logic, a negative logic (0 |V|) signal is output from the inverter 78.

As described above, the logical product circuit 69 outputs a negative logic signal if a logical value indicating a fact that a large electric current has flowed in the MOS-FET 61 is obtained from the excess current detection circuit 68 or the control signal So is a signal for switching the MOS-FET 61 off.

The buffer 79 is supplied with the output from the charge pump 57 so that the gate of the MOS-FET 61 has a voltage level required to switch the MOS-FET 61 on. That is, the output of the positive logic from the inverter 78 is, in this embodiment, set to be 5 |V| which is shifted by 12 |V| by the buffer 79. Thus, the output from the buffer is made to be 17 |V|.

Therefore, if the output from the inverter is positive logic, voltage of 17 |V| is applied to the gate of the MOS-FET 61 so that the MOS-FET 61 is normally switched on. If the output from the inverter is negative logic, the buffer 79 has the ground potential. As a result, no difference in the potential can be obtained between the gate and the source, thus resulting in that the MOS-FET 61 is switched off. Note that a diode 81 and a zener diode 82 are connected between the gate and the source of the MOS-FET 61 so that excess voltage allowed to be applied to the gate is bypassed to prevent damage of the MOS-FET 61.

The temperature detection circuit 70 has a temperature detection device 83 formed by vertically connecting a plurality of diodes. Actually, the temperature detection device 83 is disposed adjacent to the MOS-FET 61. The temperature detection circuit 70 has a structure such that the temperature detection device 83 is connected to the inverted input terminal of the comparator 84 and the reference voltage generated by the reference voltage generator 85 is supplied to the non-inverted input terminal of the comparator 84.

Therefore, in the temperature detection circuit 70, when the temperature of the MOS-FET 61 is raised, the resistance value of each of the diodes forming the temperature detection device 83 is weakened. Thus, the potential of the inverted input terminal of the comparator 84 is lowered. When the potential of the inverted input terminal has been made to a be lower than the reference potential, positive logic is output a from the temperature detection device 83. For example, positive logic is output when the temperature of the MOS-FET 61 is greater than or equal to than 150 |°|. The logic output from the comparator 84 is supplied to the overheat preventive circuit 71 through an inverter 86.

The overheat preventive circuit 71 mainly comprises a JK flip-flop 87 arranged to be operated in accordance with the logic value supplied from the temperature detection circuit 70 and the control signal So, and a FET 88 arranged to be turned on/off in accordance with the output from the JK flip-flop 87 so as to change the gate voltage of the main MOS-FET 61 so as to switch the MOS-FET 61 on/off.

Specifically, clock input CL of the JK flip-flop 87 is supplied with logic output from the temperature detection circuit 70, while a collector of the transistor Tr1 is connected to reset input R of the same. The base of the transistor Tr1 is arranged to be supplied with the control signal So through a one-shot multi-vibrator 89. When the control signal So has been changed from negative logic to positive logic, the output pulse from the one-shot multi-vibrator 89 rises and thus an emitter current flows from the collector of the transistor Tr1 to the emitter of the same. As a result, the potential of the reset input R rises so that the JK flip-flop 87 is reset. The input J of the JK flip-flop 87 is supplied with power supply voltage $V_{DD}$ stabilized by a regulator 90. Moreover, input K and set input S are grounded.

Figure 4:
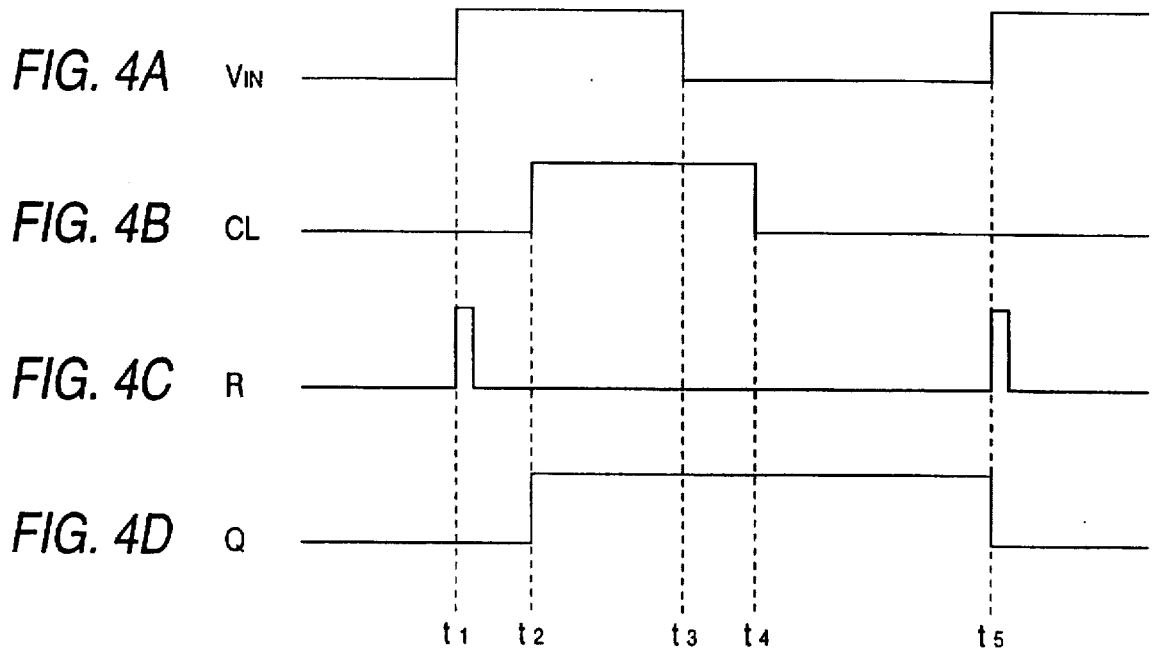
FIGS. 4(A) to 4(D) are timing charts for use in describing the operation of the JK flip-flop shown in FIG. 3.

The operation of the JK flip-flop 87 will now be described with reference to FIG. 4. That is, when the control signal So has been positive logic at time t1 (see FIG. 4(A)), the output pulse from the one-shot multi-vibrator 89 rises to raise the base potential-of the transistor Tr1. As a result, a reset pulse (see FIG. 4(C)) having a pulse width corresponding to the output panel is supplied to the reset input R so that the JK flip-flop 87 is brought to a reset state.

When the temperature of the MOS-FET 61 has been raised to a level higher than a predetermined level at time t2 in the above-mentioned state, the logic output which is supplied from the temperature detection circuit 70 to the clock input CL is made to be positive logic (see FIG. 4(B)). Thus, output Q is made to be positive logic. Even if the supplied control signal So has been made to be negative logic at time t3 or even if the logic output which is supplied from the temperature detection circuit 70 to the clock input CL is made to be negative logic at time t4, the JK flip-flop 87 maintains the foregoing state so that it continuously outputs positive logic as the output Q. Then, the negative logic control signal So is again made to be positive logic at time t5 and thus a reset pulse is supplied to the reset input R so that the output Q is inverted from positive logic to negative logic (see FIG. 4(D)).

As described above, the JK flip-flop 87 outputs positive logic output Q only when the output from the temperature detection circuit 70 has been made to be positive logic in a state where the control signal So is in the positive logic state. Even if the output from the temperature detection circuit 70 is made to be negative logic afterwards, it maintains the foregoing state. The reason why the overheat preventive circuit 71 is formed into a latch structure and the MOS-FET 61, the temperature of which has been raised to be higher than a predetermined level, remains switched off until the control signal So is supplied to switch the MOS-FET 61 on, will now be described.

That is, if the overheat preventive circuit is not formed into the latch structure and the switching operation of the MOS-FET 61 is attempted to be controlled in a real-time manner in accordance with the detected temperature, the MOS-FET 61 is switched on because the temperature of the MOS-FET 61 is lowered immediately after the MOS-FET 61 has been switched off because the MOS-FET 61 has been heated to be a temperature higher than a predetermined level. Then, the temperature of the MOS-FET 61 is raised again, and thus the MOS-FET 61 is switched off. If the switching operation is repeated in a short time, instable electric power is supplied to the load. Therefore, the structure is formed such that the MOS-FET 61 is switched on only when the control signal So has been made to be negative logic and then again made to be positive logic.

The output Q from the JK flip-flop 87 is, similarly to the foregoing buffer 79, supplied to the gate of the FET 88 through the buffer 91 to which the output (17 [V]) from the charge pump 57 is supplied and which shifts the level of the input by 12 [V]. As a result, in a case where the output Q is positive logic (5 [V]), voltage of 17 [V] is applied to the gate of the FET 88. Thus, the FET 88 is turned on. If the output Q is negative logic (0 [V]), the output from the charge pump 57 is supplied to the gate of the FET 88. Therefore, the FET 88 is turned off.

Since the gate of the MOS-FET 61 is made to be the ground potential when the FET 88 has been turned on, the MOS-FET 61 is forcibly turned off regardless of the logic output from the logical product circuit 69. If the FET 88 is turned off, the gate potential of the MOS-FET 61 has a level corresponding to the logic output from the logical product circuit 69.

Since the temperature detection circuit 70 and the overheat preventive circuit 71 are able to forcibly switch the MOS-FET 61 off at least in a period in which the temperature of the MOS-FET 61 is higher than a predetermined level, damage of the MOS-FET 61 attributable to overheat can be prevented.

As described above, the IPS 55A is structured such that the logical product of a result of detection of an excess current performed by the excess current detection circuit 68 and the control signal So is obtained; and voltage corresponding to the result of the logical product is applied to the gate of the MOS-FET 61. Thus, if a large electric current capable of breaking the MOS-FET 61 even if the electric current flows in the MOS-FET 61 for a short period of time flows or if the control signal So is negative logic, the MOS-FET 61 is switched off. Moreover, the electric current detection circuit 67 performs a latching operation in accordance with a result of detection of the temperature performed by the temperature detection circuit 70 and the control signal So to forcibly switch MOS-FET 41 off through the MOS-FET 68 if the temperature of the MOS-FET 41 is raised.

As a result, the IPS 55A is not structured such that a result of detection of an excess current and a result of detection of overheat are collectively used to cause the latching operation to be performed and a logical sum is obtained to control the switching operation of the MOS-FET 61. As an alternative to this, the results are processed by individual systems so that the switching operation of the MOS-FET 61 is individually controlled in accordance with results of detection.

In addition to the above-mentioned structure, the IPS 55A has a load open detection circuit 100 and an excess voltage detection circuit 101. The load open detection circuit 100 supplies voltage obtained by dividing power supply voltage $V_B$ to the non-inverted input terminal of the comparator 102 and supplies, to the inverted input terminal of the same, the voltage at the output terminal 63. As a result, if a so-called load open state is realized such that a switch (not shown) disposed between the output terminal 63 and the load 64 is switched off, the load open detection circuit 100 causes the comparator 102 to output a signal indicating this.

In the excess voltage detection circuit 101, the inverted input terminal of the comparator 103 is supplied with reference voltage obtained by causing power supply voltage $V_B$ to pass through the zener diode 104 and the divided-voltage resistors R6 and R7. The non-inverted input terminal of the same is supplied with the power supply voltage $V_B$ divided by divided-voltage resistors R8 and R9. As a result, if the excessively high power supply voltage $V_B$ is output from the battery 56, the excess voltage detection circuit 101 causes the comparator 103 to output a positive logic signal indicating this.

The output from the comparator 102 is supplied to the gate of a transistor Tr2 through a resistor R10. On the other hand, the output from the comparator 103 is supplied to the gate of a transistor Tr3 through a resistor R11. The drain of the transistor Tr2 is connected between the output of the electric current detection circuit 67 and the current monitoring output terminal 107, while the source of the same is grounded. The drain of the transistor Tr3 is connected between the output of the electric current detection circuit 67 and the current monitoring output terminal 107 through a resistor R12, while the source of the same is grounded.

As a result, when the load has been brought to the opened state, the transistor Tr2 lowers the potential of the current monitoring output terminal 107 to substantially zero potential. If the power supply voltage VB has been raised excessively, the transistor Tr3 lowers the same to a level somewhat higher than the level realized in the case where the load is opened by a degree corresponding to the voltage drop of the resistor R12.

Since the electric current detection circuit 67 is composed of the difference amplifying circuit 72, it outputs voltage having an offset as an output indicating a detected electric current. As a result, even in a case where the MOS-FET 61 is turned off, the output potential from the electric current detection circuit 67 is made to be a value apart from the zero potential by the degree corresponding to the offset. Also the potential of the current monitoring output terminal 107 is not made to be zero potential but the same is made to be an offset potential. However, if the load open state is realized, the potential of the current monitoring output terminal 107 is forcibly lowered to substantially the zero potential. If the power supply voltage VB is made to be excessively high voltage, the foregoing potential is lowered to a level higher than that realized when the load has been opened and lower than the offset potential.

As a result, in the IPS 55A, detection of the potential of the current monitoring output terminal 107 enables easy determination to be performed whether overheat of the MOS-FET 61 or flow of a large electric current in the same causes the protective function to be operated to inhibit supply of electric power to the load 65 or opening of the load inhibits electric power to the load 65. Moreover, excessively high voltage of the power supply voltage $V_B$ can easily be detected.

That is, inhibition of electric power to the load 65 takes place in a case where the overheat protective function or the excess current protective function is operated and in a case where the load has been opened. However, only the output value from the electric current detection circuit 67 is insufficient to determine the cause of the inhibition of electric power to the load 65. Accordingly, the IPS 55A is structured to positively use the offset of the electric current detection circuit 67 to enable the cause of the inhibition of supply of electric power to the load 65 to be determined with a relatively simple structure.

(2-2) Structure of Microcomputer

The microcomputer 54 monitors the electric current characteristic output from the IPS 55A in accordance with the voltage of the current monitoring output terminal 107 of the IPS 55A including a time factor so as to determine whether or not an excess current capable of breaking the MOS-FET 61 flows. Moreover, it determines whether or not an electric current capable of fuming of the electric wire 64 to take place flows. If it determines that an electric current of the foregoing type flows, the microcomputer 54 outputs the control signal SO for forcibly turning the MOS-FET 61 off. Moreover, the microcomputer 54 detects the cause of inhibition of supply of electric power to the load 65 in accordance with the voltage of the current monitoring output terminal 107.

The microcomputer 54 causes an A/D conversion circuit (A/D) 54A to convert the voltage of the current monitoring output terminal 107 into 8-bit digital data at a sampling period of, for example, 5 [ms], and then transmits the same to a CPU (Central Processing Unit) 54B. In accordance with output data from the A/D conversion circuit 54A, the CPU 54B detects the time and amount of the electric current which has flowed in the MOS-FET 61 to subject results of the detection and threshold data F stored in the memory 54C to a comparison so as to control the switching operation of the MOS-FET 61 in accordance with the result of the comparison.

Figure 5:
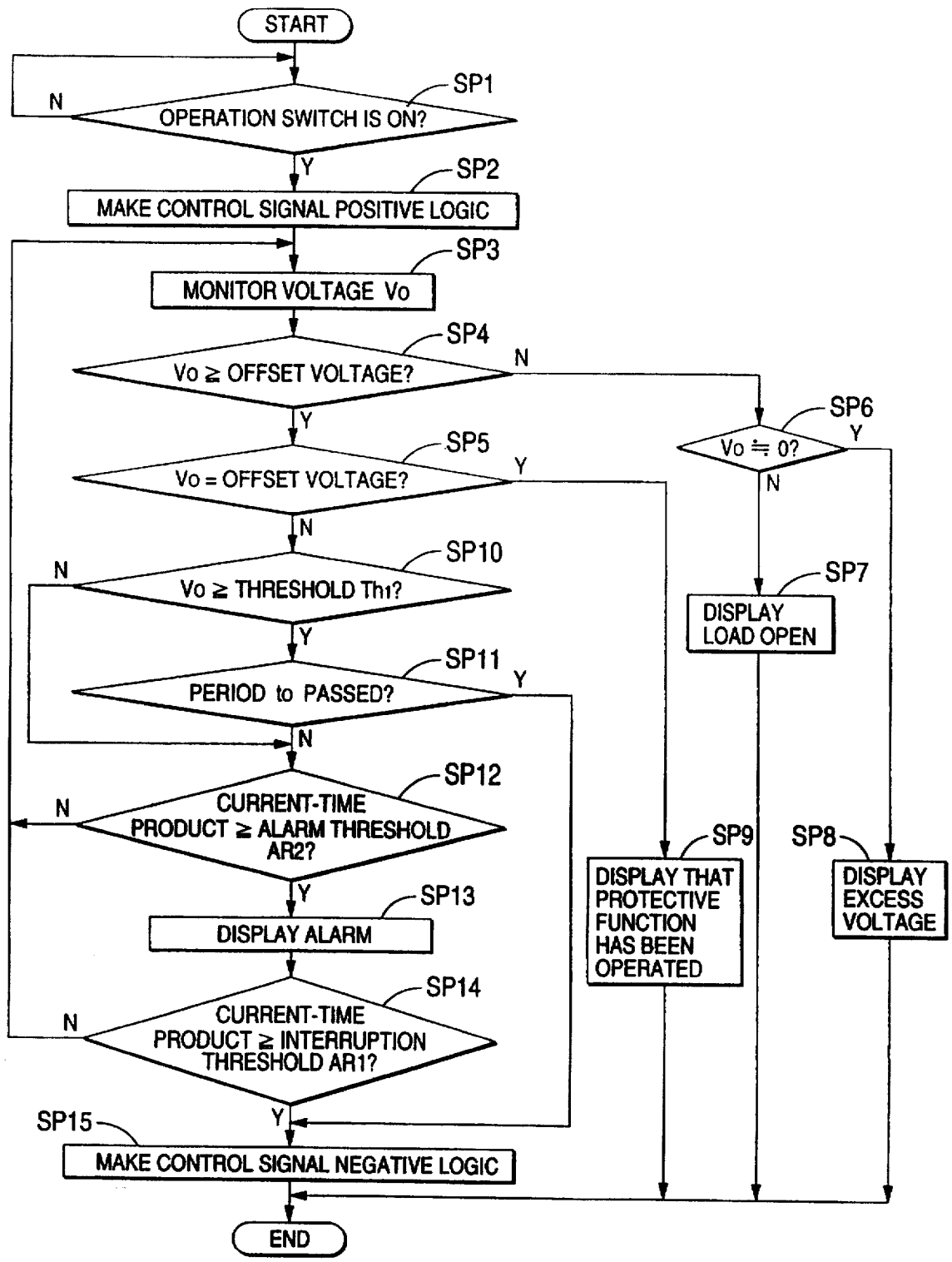
FIG. 5 is a flow chart of a procedure of a process for monitoring an electric current and a switching control process which are performed by the CPU shown in FIG. 3.

At this time, the CPU 54B executes a procedure structured as shown in FIG. 5. In step SP1 the CPU 54B determines whether or not an operation switch 108 corresponding to the IPS 55A has been switched on. If it has determined that the operation switch 108 has been switched on, the operation proceeds to step SP2 so that the control signal So is made to be positive logic to switch the MOS-FET 61 on.

Then, the CPU 54B, in step SP3, monitors the voltage Vo of the current monitoring output terminal 107. In step SP4 whether or not the voltage Vo is higher than the offset voltage of the difference amplifying circuit 72 is determined. If the voltage Vo is higher than the offset voltage, the operation proceeds to step SP5. If the CPU 54B has obtained a result of detection that the voltage Vo is lower than the offset voltage, the operation proceeds to step SP6 so as to determine whether or not the voltage Vo is substantially zero.

A fact that an affirmative result is obtained in step SP6 means that a positive logic signal indicating load open has been obtained by the load open detection circuit 100 and thus the transistor Tr2 has been turned on and the voltage of the current monitoring output terminal 107 has been made to be substantially zero. At this time, the operation of the CPU 54B is proceeds to step SP7 so as to cause a display portion 109 to display that the load has been opened. On the other hand, a fact that a negative result is obtained in step SP6 means that a positive logic signal indicating output of excessively high power supply voltage $V_B$ from the battery 56 has been obtained by the excess voltage detection circuit 101 and thus the transistor Tr3 has been turned on and the voltage of the current monitoring output terminal 107 is lower than the offset voltage and higher than zero. At this time, the operation of the CPU 54B proceeds to step SP8 so as to cause the display portion 109 to display that the voltage is excessively high.

In step SP5 whether or not the voltage Vo is the same as the offset voltage is determined. If the two voltage levels are the same, the operation proceeds to step SP9 so as to cause the display portion 109 to display the operation of a self-protective function of the intelligent power switch 55 for switching the MOS-FET 61 off.

If a negative result has been obtained in step SP5, that is, if the voltage Vo is higher than the offset voltage, the operation of the CPU 54B proceeds to step SP10. In step SP10 a comparison is performed to determine whether or not the voltage Vo is higher than the threshold Th1 stored in the memory 54C. If an affirmative result has been obtained, the operation proceeds to step SP11. If a negative result has been obtained, the operation proceeds to step SP12. In step SP11 whether or not an electric current higher than the threshold Th1 has flowed continuously for a period to is determined. If the electric current has flowed as described above, the operation proceeds to step SP15. If the electric current has not flowed, the operation proceeds to step SP12.

Figure 6:
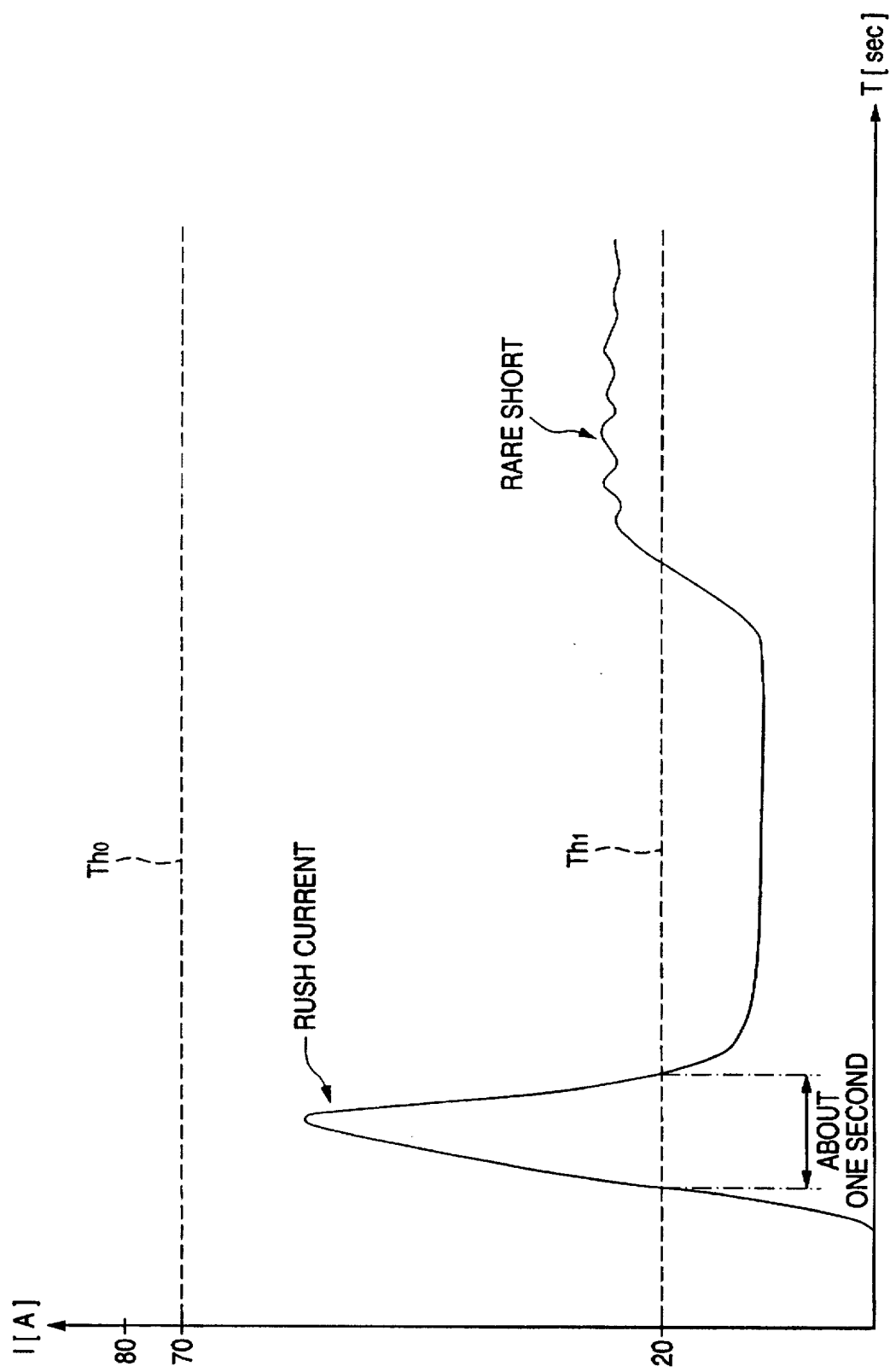
FIG. 6 is a graph showing the relationship between thresholds of a comparator and thresholds stored in a memory.

The threshold Th1 is set to be a value corresponding to an electric current level about 20 [A] if the MOS-FET 61 has the rated electric current value of about 10 [A], as shown in FIG. 6. The electric current higher than the threshold Th1 is an electric current which does not damage the MOS-FET 61 if it flows for a short time but with which the MOS-FET 61 can be damaged if it continuously flows for a predetermined time to.

That is, in a case where an electric current higher than threshold Th1 continuously flows as is experienced when a load is short-circuited or when rare short takes place, the CPU 54B sequentially performs steps SP10, SP11 to SP15 so as to turn the MOS-FET 61 off. If an electric current, such as a rush current, higher than the threshold Th1 does not flow continuously for the period to or longer, there is no risk that the MOS-FET 61 is damaged. Therefore, the CPU 54B sequentially executes steps SP10, SP11 and SP12 so that the MOS-FET 61 is not turned off.

Since the first threshold Tho of the comparator 73 in the intelligent power switch 55 is set to be a very high level of about 70 [A], the MOS-FET 61 is not turned off because the self-protective function of the intelligent power switch 55 is not operated with a usual rush current. As a result, an unintentional turning off control attributable to a rush current can be prevented.

The CPU 54B subjects the current-time product of electric current Io obtained from the voltage level of the current monitoring output terminal 107 and an alarm threshold read from the memory 54C to a comparison. If the current-time production is larger than the alarm threshold, the operation proceeds to step SP13. If it is smaller than the threshold, the operation returns to step SP3.

If the level of the electric current Io is somewhat raised or the time for which the electric current Io flows is elongated, an alarm indicating that the MOS-FET 61 is turned off is displayed on the display portion 109 in step SP13 because the electric wire 64 can be damaged (fumed).

Then, the CPU 54B, in step SP14, reads an interruption threshold determined in consideration of the fuming characteristic of the electric wire 64 from the memory 54C to subject the current-time product and the interruption threshold to a comparison. If the current-time product is larger than the interruption threshold, the operation returns to step SP15. If it is smaller than the interruption threshold, the operation returns to step SP3. A fact that an affirmative result is obtained in step SP14 means a fact that the electric wire 64 is in a substantially fuming state. In this case, the operation of the CPU 54B is shifted to step SP15 so that the control signal So is made to be negative logic to turn the MOS-FET 61 off.

As described above, the CPU 54B is able to turn on/off the MOS-FET 61 in consideration of the load which must be borne by the electric wire 64 in accordance with the current characteristic of the electric current Io which flows in the electric wire 64. Therefore, fuming of the electric wire 64 can be prevented even if a fuse is not provided in front of the IPS 55A.

Since the IPS 55A has the load open detection circuit 100 and the excess voltage detection circuit 101, the CPU 54B is able to easily detect the cause of inhibition of supply of electric power from the battery 56 to the load 65.

Figure 7:
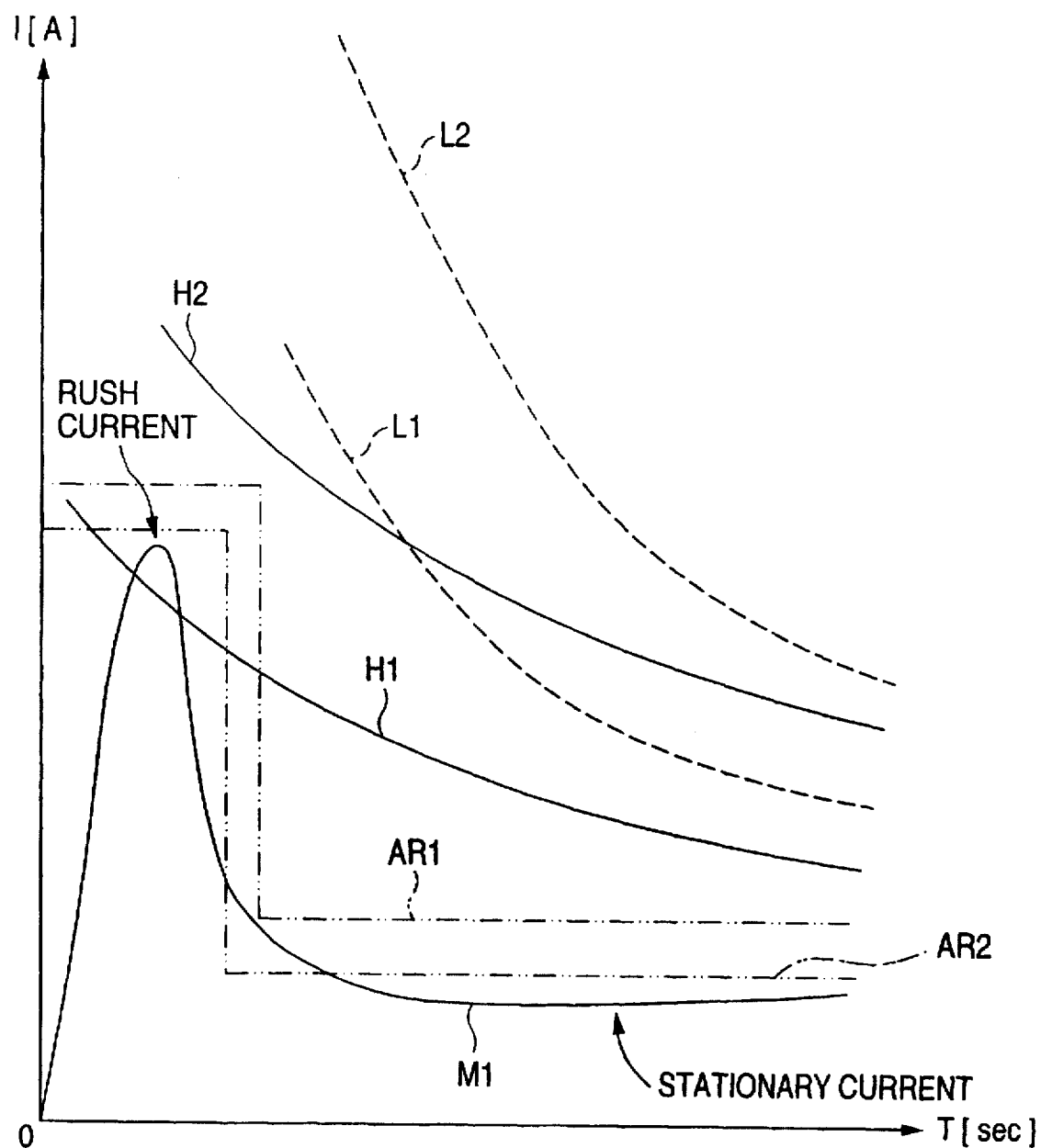
FIG. 7 is a graph showing the relationship among fuming characteristics of a wire harness, fusing characteristics and interruption characteristics realized by a CPU according to an embodiment.
Figure 8:
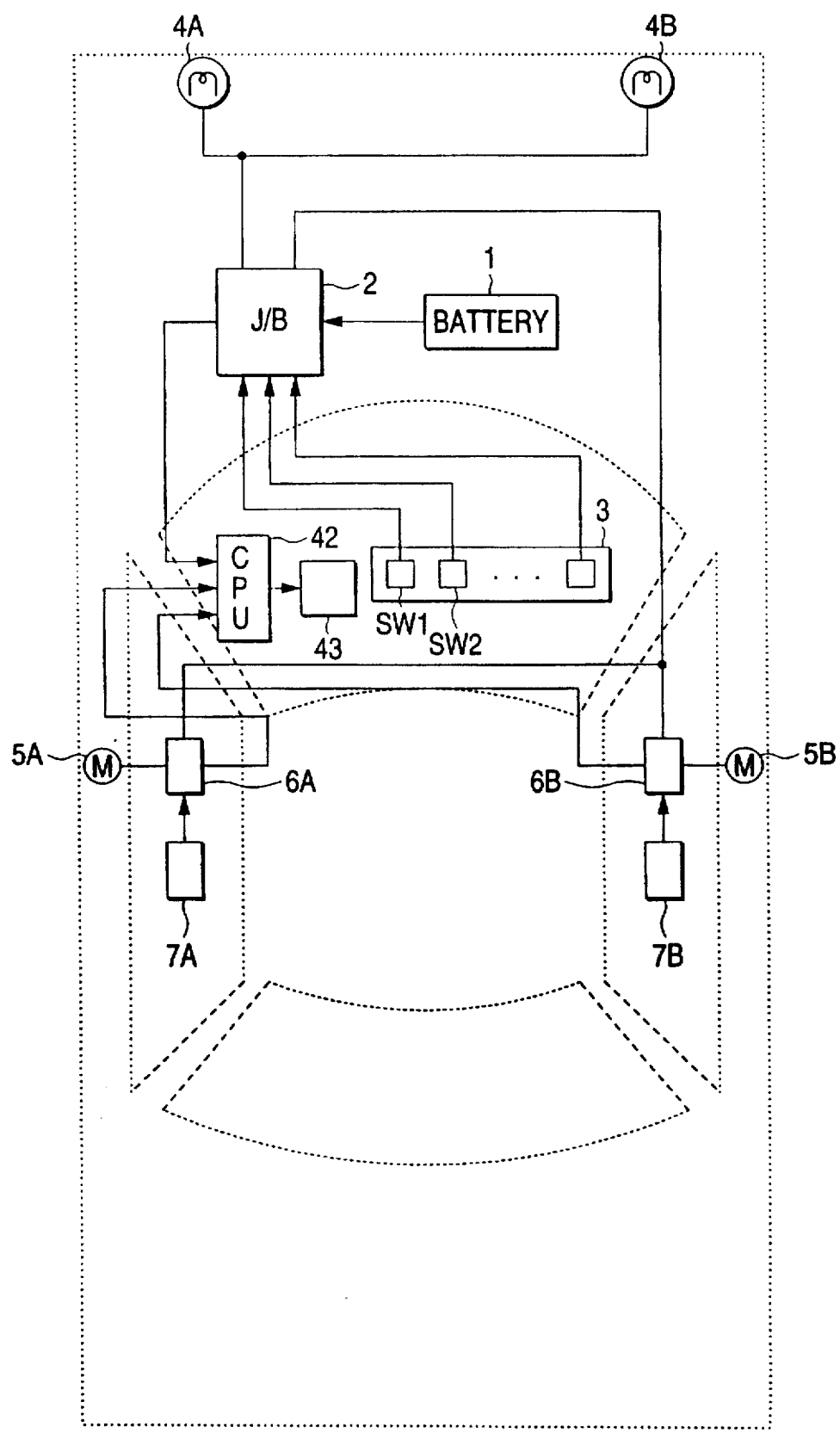
FIG. 8 is a schematic view for use in describing supply of electric power to each load in an automobile.
Figure 9:
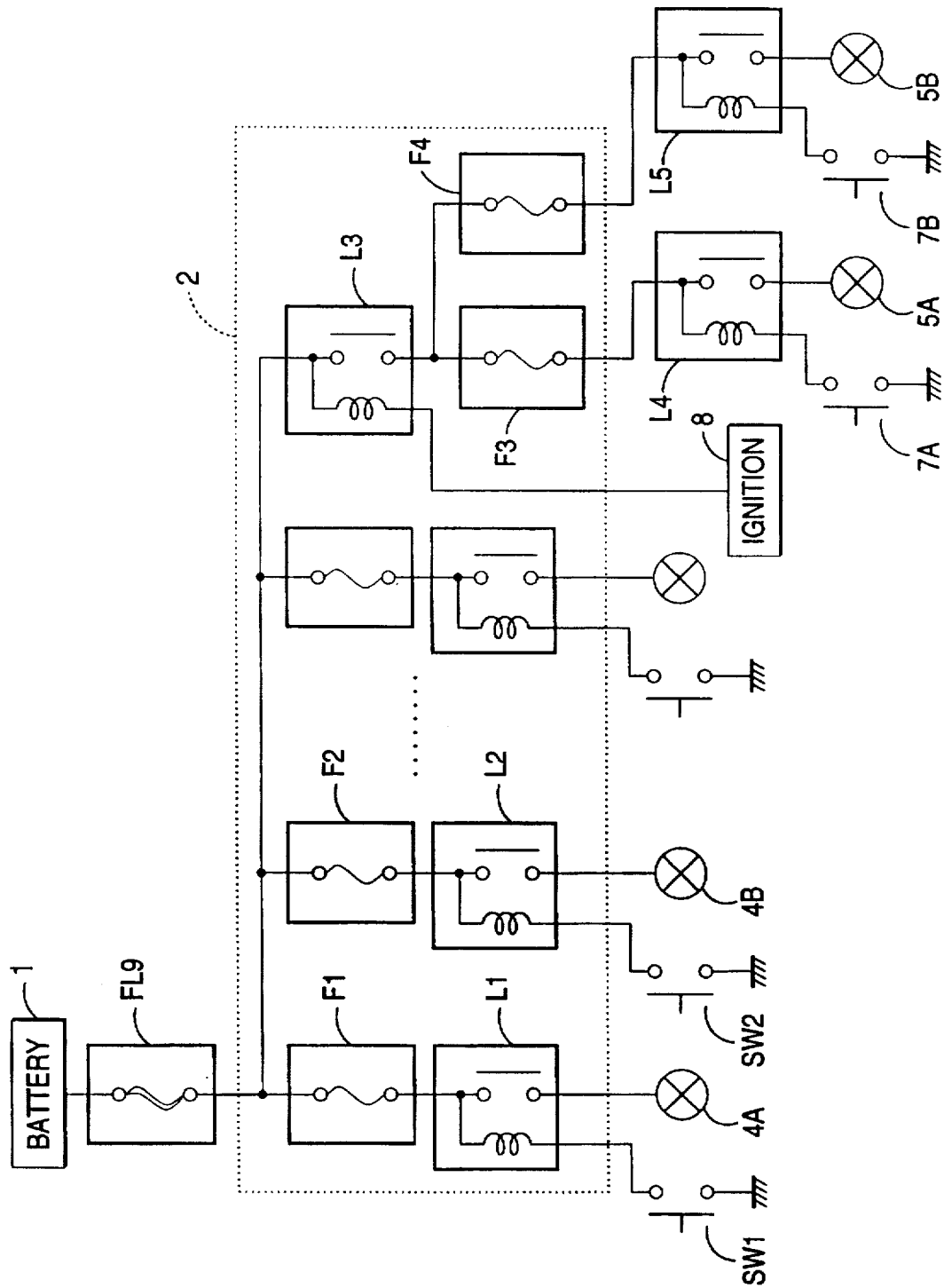
FIG. 9 is a schematic view for use in describing a junction block using a relay having a mechanical contact.
Figure 10:
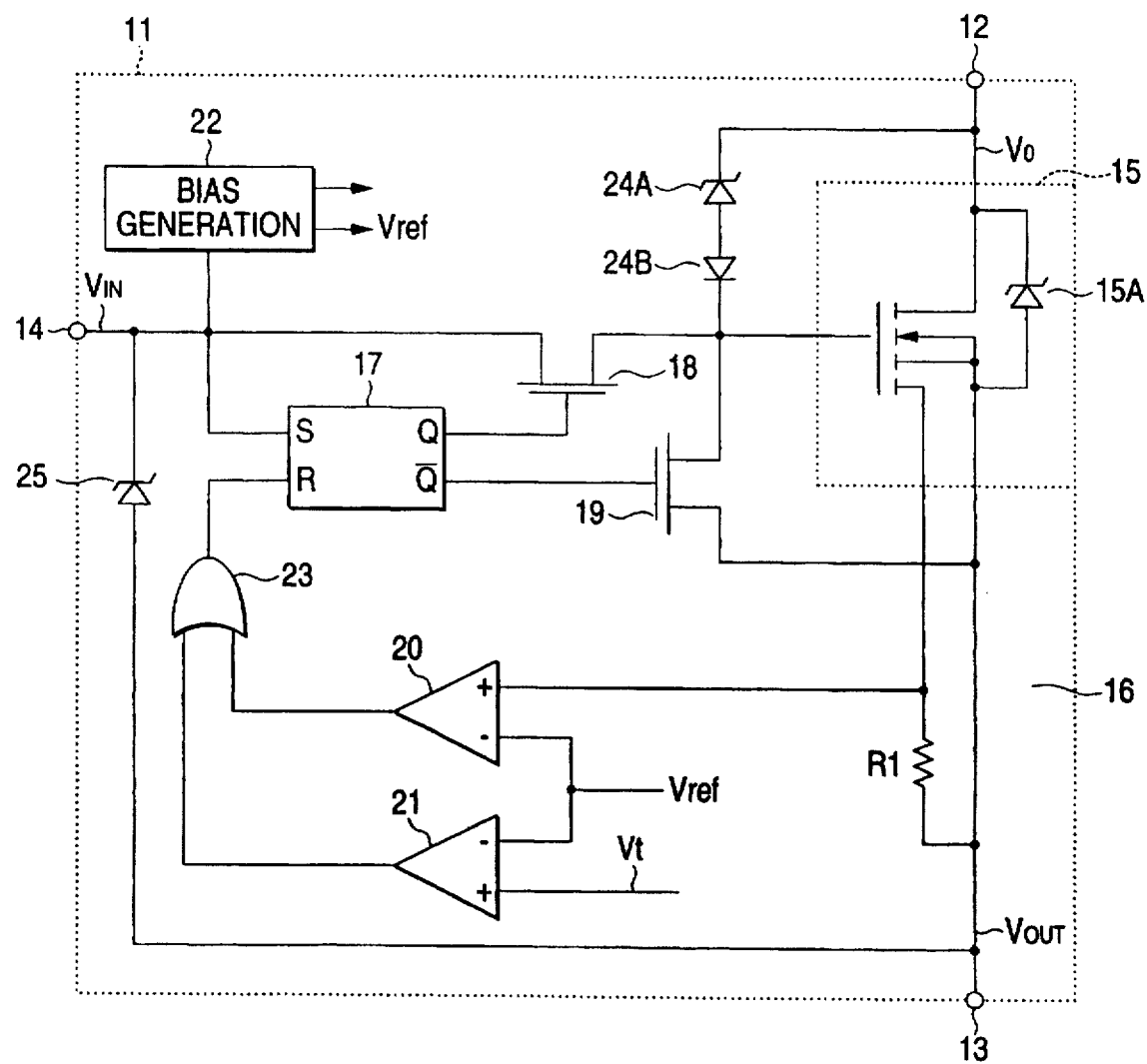
FIG. 10 is a circuit connection diagram showing the structure of a conventional switching circuit having a protective function.
Figure 11:
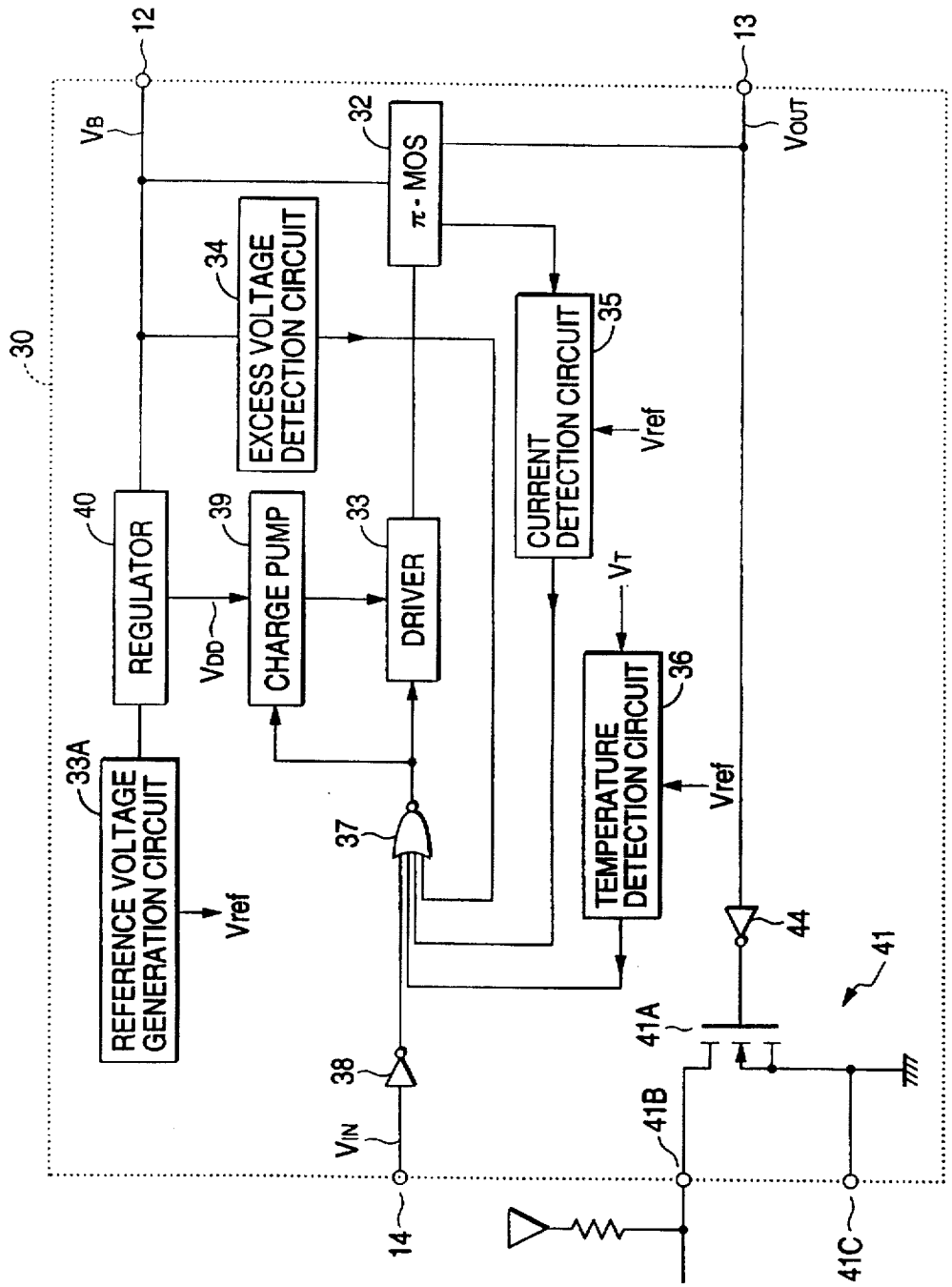
FIG. 11 is a block diagram showing the structure of a conventional intelligent power switch.
Figure 12:
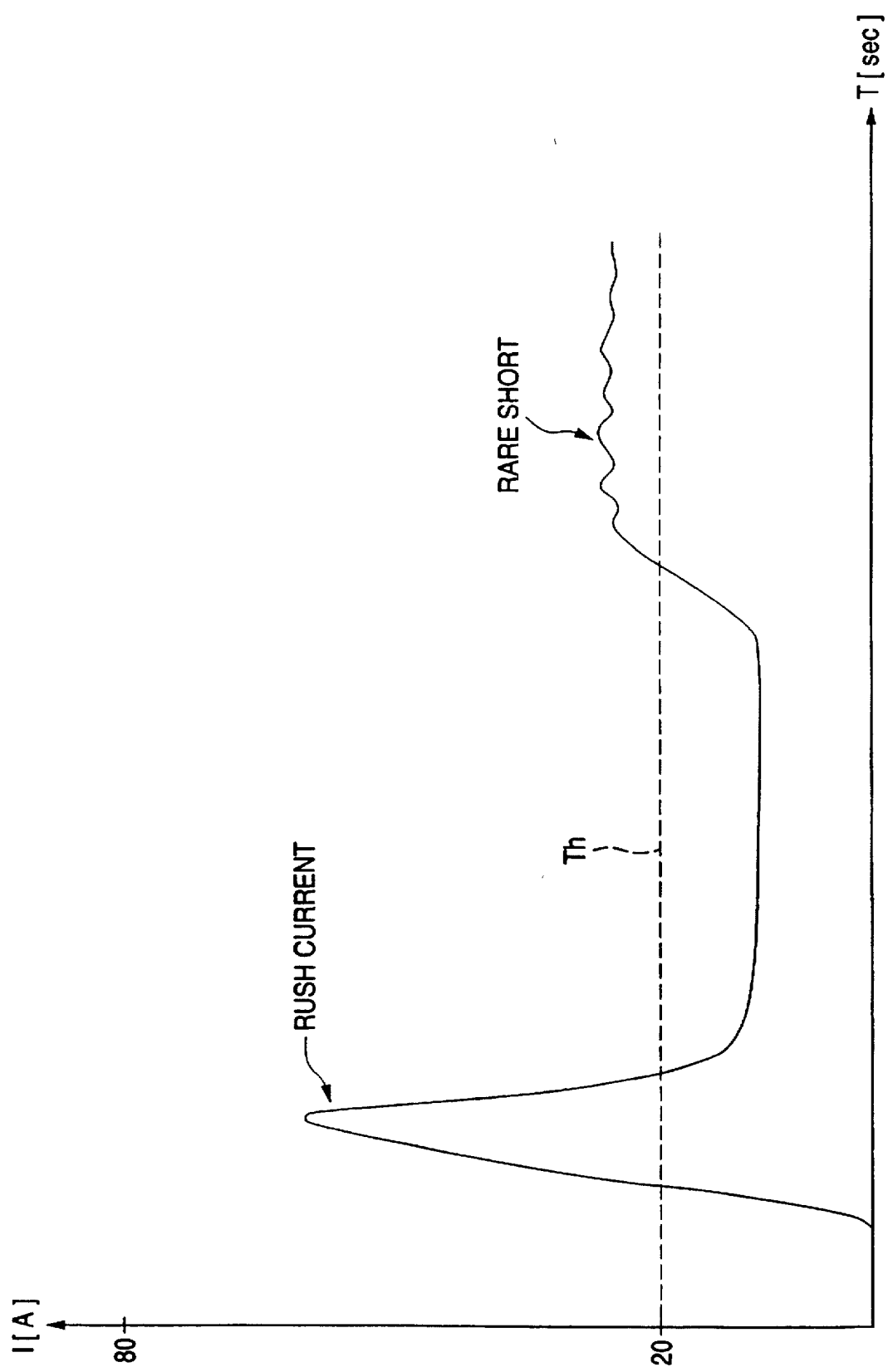
FIG. 12 is a graph for use in describing a threshold value for detecting an excess current for a conventional switching circuit having a self-protective function.

FIG. 7 shows the relationship among the fuming characteristic of the wire harness, the characteristic of the fuse disposed in front of the IPS in the conventional structure and the interruption characteristic realized by the control according to this embodiment and performed by the CPU. Curve L1 indicates the fuming characteristic of the wire harness composed of relatively thin electric wires, and curve L2 indicates the fuming characteristic of the wire harness composed of relatively thick electric wires. Curve H1 indicates a fusing characteristic of a small-capacity fuse corresponding to the thin electric wire, and curve H2 indicates a fusing characteristic of a large-capacity fuse corresponding to the thick electric wire. Curve M1 indicates an operation waveform of the load, and AR1 indicates an ideal interruption characteristic of a semiconductor switch.

When a small-capacity fuse adaptable to the stationary electric current in the load is used, the fusing characteristic H1 overlaps the rush current portion of the load operation waveform M1. Therefore, the fuse is melted. If a large-capacity fuse is employed to prevent overlap of the rush current portion, the size of the electric wire must be enlarged (an electric wire having the fusing characteristic L2 must be used) because the fusing characteristic H2 intersects the fuming characteristic L1.

As described above, if a fuse with which the load can be operated (that is, if a fuse which cannot be fused even with a rush current is selected), there arises a problem in that the size of the electric wire must be changed according to circumstances. However, this embodiment is required to simply store ideal interruption characteristic AR1 determined in consideration of the fuming characteristic L1 of the electric wire 64 and the operation waveform M1 of the load 65 as threshold data in the memory 54C. Thus, change of the size of the electric wire is not required to prevent fuming of the electric wire and enable the operation of the load to be performed in all current regions. Note that the alternate long and two short dashes line AR2 in the drawing indicates the alarm threshold for causing the display portion 109 to display the alarm and is stored in the microcomputer 54 together with the interruption threshold AR1. If the electric current characteristic exceeds the alarm threshold AR2, the CPU 54B issues a command to cause the display portion 109 to display the alarm.

As a result of forming the IPS 55A and the microcomputer 54 as described above, even if the thickness of the electric wire 64 and the operation permitted region for the load 65 are changed, simple storage of new threshold data F corresponding to the change on the memory 54C is required. Thus, the structure of the hardware is not required to be changed.

(3) Effects

In the above-mentioned structure, the first threshold Tho corresponding to a large electric current capable of breaking the semiconductor switch if the electric current flows even for a short time is provided for the difference amplifying circuit 72 and the second threshold Th1 lower than the first threshold Tho is stored in the memory 54C. Thus, if the detected electric current value is higher than the first threshold Tho, or if the CPU 54B determines that an electric current higher than the second threshold Th1 has flowed continuously for the predetermined time to or longer, the semiconductor switch is arranged to be switched off. Thus, the semiconductor switch is not unintentionally switched off by the rush current, and the semiconductor switch can sufficiently be protected.

In a case where the current-time product of the current level Io is larger than the threshold data AR1 stored in the memory 54C, the MOS-FET 61 is turned off. Thus, a fuse corresponding to each load 65 is not required to reliably prevent fuming of the electric wire 64. Therefore, a switching apparatus 50 thus having a simple structure can be realized.

(4) Another Embodiment

Although the foregoing embodiment has been described about the structure in which the intelligent power switch and the switching apparatus according to the present invention is used in the junction block, the present invention is not limited to this. The present invention may widely be applied to a semiconductor switch which is switched on in response to input of a control signal to the control signal input terminal to supply electric power to a load connected to the output terminal thereof, an intelligent power switch and a switching apparatus having the excess current protective means arranged to output a signal to a control signal input terminal of a semiconductor switch if an excess current has flowed in the semiconductor switch to switch the semiconductor switch off so as to protect the semiconductor switch from the excess current.

Although the above-mentioned embodiment has been described about the structure in which the MOS-FET 61 is employed as the semiconductor switch, the semiconductor switch according to the present invention is not limited to this. A similar effect can be obtained even if another semiconductor switch is employed.

As described above, the invention of the first aspect is provided with a semiconductor switch arranged to be switched on in response to input of a control signal to a control signal input terminal to supply electric power from a power source to a load connected to an output terminal; excess current protective means for protecting the semiconductor switch from an excess current by outputting a signal to the control signal input terminal of the semiconductor switch to switch the semiconductor switch off in a case where the excess current has flowed in the semiconductor switch; electric current detection means for detecting an electric current which flows in the semiconductor switch; and external output means for outputting en electric current level detected by the electric current detection means. Therefore, an intelligent power switch can be realized which is capable of easily determining whether an abnormal electric current flows in the semiconductor switch or a normal electric current flows in the same by monitoring the detected electric current value output from the external output means.

A switching apparatus of the second aspect comprises an intelligent power switch of the first aspect; control means connected to the external output means and arranged to monitor the electric current detected by the electric current detection means and to output a signal to the control signal input terminal of the semiconductor switch so as to switch the semiconductor switch off when a result of monitoring is obtained which indicates a fact that an abnormal electric current has flowed in the semiconductor switch; and data storage means having threshold data stored therein with which the control means determines whether or not the abnormal electric current has flowed.

A switching apparatus of the third aspect has the structure such that the excess current protective means has one of input terminals for receiving a voltage level corresponding to the level of an electric current which flows in the semiconductor switch and the other input terminal for receiving a reference voltage level corresponding to an electric current level destructive to the semiconductor switch if the electric current flows in the semiconductor switch even in a short period of time, the excess current protective means being arranged to output a signal to the control signal input terminal of the semiconductor switch from an output terminal thereof when the voltage level corresponding to the electric current which flows in the semiconductor switch has exceeded the reference voltage level so as to switch the semiconductor switch off, the data storage means has an electric current level stored therein as threshold data which is lower than the electric current level destructive to the semiconductor switch if the electric current flows in the same even in a short period of time, and the control means outputs a signal to the control signal input terminal of the semiconductor switch so as to switch the semiconductor switch off in a case where an electric current higher than threshold data continuously flows in the semiconductor switch for a period of time longer than a predetermined period of time. Thus, a switching apparatus can be realized with which the semiconductor switch is not switched off when a rush current flows and the semiconductor switch can be switched off if an abnormal electric current capable of damaging the semiconductor switch flows.

A switching apparatus of the fourth aspect has the structure such that the data storage means has threshold data stored therein and determined in consideration of fuming characteristics of an electric wire for establishing the connection between the semiconductor switch and the load, and the control means monitors a current-time product of the detected electric current and subjects the current-time product and threshold data to a comparison so as to switch the semiconductor switch off when the current-time product exceeds threshold data. Thus, fuming of an electric wire can be prevented without a fuse corresponding to each load. Thus, the structure can be simplified to an extent corresponding to the omission.

A switching apparatus of the fifth aspect has the structure such that the excess current protective means has one of input terminals for receiving a voltage level corresponding to the level of an electric current which flows in the semiconductor switch and the other input terminal for receiving a reference voltage level corresponding to an electric current level destructive to the semiconductor switch if the electric current flows in the semiconductor switch even in a short period of time, the excess current protective means being arranged to output a signal to the control signal input terminal of the semiconductor switch from an output terminal thereof when the voltage level corresponding to the electric current which flows in the semiconductor switch has exceeded the reference voltage level so as to switch the semiconductor switch off, the data storage means has an electric current level stored therein as first threshold data which is lower than the electric current level destructive to the semiconductor switch if the electric current flows in the same even in a short period of time and second threshold data stored therein as second threshold data which is determined in consideration of fuming characteristics of an electric wire for establishing the connection between the semiconductor switch and the load, and the control means switches the semiconductor switch off in a case where an electric current higher than first threshold data has continuously flowed in the semiconductor switch for a period of time longer than a predetermined period of time or in a case where a current-time product of the detected electric current in a predetermined period of time is larger than second threshold data. Therefore, a switching apparatus can be realized which is capable of protecting the semiconductor switch from an excess current such that the semiconductor switch is not switched off when a usual rush current flows and as well as capable of preventing fuming of an electric wire.

A switching apparatus of the sixth aspect has the structure such that the data storage means has threshold data stored therein which is smaller than the fuming characteristics of an electric wire for establishing the connection between the semiconductor switch and the load and larger than an operation enabling characteristic of the load, and the control means switches the semiconductor switch off when a current-time product of the detected electric current is larger than threshold data. Thus, a switching apparatus can be realized which is capable of switching the semiconductor switch on in an electric current range in which the operation of the load can sufficiently be permitted and fuming of the electric wire can reliably be prevented.

What is claimed is:

1. An intelligent power switch comprising:

a semiconductor switch arranged to be switched on in response to input of a control signal to a control signal input terminal to supply electric power from a power source to a load connected to an output terminal;

excess current protective means for protecting said semiconductor switch from a current in excess of a rush current by outputting a signal to said control signal input terminal of said semiconductor switch to switch said semiconductor switch off in a case where a current in excess of said rush current has flowed in said semiconductor switch;

electric current detection means for detecting an electric current which flows in said semiconductor switch; and external output means for outputting an electric current level detected by said electric current detection means.

2. A switching apparatus comprising:

an intelligent power switch as recited in claim 1;

control means connected to said external output means and arranged to monitor the electric current detected by said electric current detection means and to output a signal to said control signal input terminal of said semiconductor switch so as to switch said semiconductor switch off when a result of monitoring is obtained which indicates a fact that an abnormal electric current has flowed in said semiconductor switch; and data storage means having threshold data stored therein with which said control means determines whether or not the abnormal electric current has flowed.

3. A switching apparatus according to claim 2, wherein said excess current protective means has one of input terminals for receiving a voltage level corresponding to the level of an electric current which flows in said semiconductor switch and the other input terminal for receiving a reference voltage level corresponding to an electric current level destructive to said semiconductor switch in a case where the electric current flows in said semiconductor switch even in a short period of time, said excess current protective means being arranged to output a signal to said control signal input terminal of said semiconductor switch from an output terminal thereof when said voltage level corresponding to the level of an electric current which flows in said semiconductor switch has exceeded said reference voltage level so as to switch said semiconductor switch off;

said data storage means has an electric current level stored therein as threshold data which is lower than said electric current level destructive to said semiconductor switch in a case where the electric current flows in the same even in a short period of time; and said control means outputs a signal to said control signal input terminal of said semiconductor switch so as to switch said semiconductor switch off in a case where an electric current higher than said threshold data continuously flows in said semiconductor switch for a period of time longer than a predetermined period of time.

4. A switching apparatus according to claim 2, wherein said data storage means has threshold data stored therein and determined in consideration of fuming characteristics of an electric wire for establishing the connection between said semiconductor switch and said load; and said control means monitors a current-time product of said detected electric current and subjects said current-time product and threshold data to a comparison so as to switch said semiconductor switch off when said current-time product exceeds threshold data.

5. A switching apparatus according to claim 2, wherein said excess current protective means has one of input terminals for receiving a voltage level corresponding to the level of an electric current which flows in said semiconductor switch and the other input terminal for receiving a reference voltage level corresponding to an electric current level destructive to said semiconductor switch in a case where the electric current flows in said semiconductor switch even in a short period of time, said excess current protective means being arranged to output a signal to said control signal input terminal of said semiconductor switch from an output terminal thereof when said voltage level corresponding to the level of an electric current which flows in said semiconductor switch has exceeded said reference voltage level so as to switch said semiconductor switch off;

said data storage means has an electric current level stored therein as first threshold data which is lower than said electric current level destructive to said semiconductor switch in a case where the electric current flows in the same even in a short period of time and second threshold data stored therein which is determined in consideration of fuming characteristics of an electric wire for establishing the connection between said semiconductor switch and said load; and said control means switches said semiconductor switch off in a case where an electric current higher than said first threshold data has continuously flowed in said semiconductor switch for a period of time longer than a predetermined period of time or in a case where a current-time product of said detected electric current in a predetermined period of time is larger than said second threshold data.

6. A switching apparatus according to claim 2, wherein said data storage means has threshold data stored therein which is smaller than fuming characteristics of an electric wire for establishing connection between said semiconductor switch and said load and larger than an operation enabling characteristic of said load, and said control means switches said semiconductor switch off when a current-time product of said detected electric current is larger than said threshold data.

7. An intelligent power switch according to claim 1, further comprising:

overheat protective means for outputting a signal to said control signal input terminal of said semiconductor switch to switch said semiconductor switch off so as to protect said semiconductor switch from overheat when temperature of said semiconductor switch has been raised to be higher than a predetermined level.

8. A switching apparatus according to claim 2, further comprising overheat protective means for outputting a signal to said control signal input terminal of said semiconductor switch to switch said semiconductor switch off so as to protect said semiconductor switch from overheat when temperature of said semiconductor switch has been raised to be higher than a predetermined level.

9. A switching apparatus comprising:

an intelligent power switch which includes:
  a semiconductor switch arranged to be switched on in response to input of a control signal to a control signal input terminal to supply electric power from a power source to a load connected to an output terminal;
  excess current protective means for protecting said semiconductor switch from an excess current by outputting a signal to said control signal input terminal of said semiconductor switch to switch said semiconductor switch off in a case where an excess current has flowed in said semiconductor switch;
  electric current detection means for detecting an electric current which flows in said semiconductor switch; and
  external output means for outputting an electric current level detected by said electric current detection means;

control means connected to said external output means and arranged to monitor the electric current detected by said electric current detection means and to output a signal to said control signal input terminal of said semiconductor switch so as to switch said semiconductor switch off when a result of monitoring is obtained which indicates a fact that an abnormal electric current has flowed in said semiconductor switch; and data storage means having threshold date stored therein with which said control means determines whether or not the abnormal electric current has flowed.

10. An intelligent power switch comprising:

a semiconductor switch arranged to be switched on in response to input of a control signal to a control signal input terminal to supply electric power from a power source to a load connected to an output terminal;

excess current protective means for protecting said semiconductor switch from a current in excess of a rush current by outputting a signal to said control signal input terminal of said semiconductor switch to switch said semiconductor switch off in a case where a current in excess of said rush current has flowed in said semiconductor switch;

electric current detection means for detecting an electric current which flows in said semiconductor switch; and external output means for outputting an electric current level detected by said electric current detection means;

wherein said rush current is the initial surge of current drawn by a circuit when voltage is first applied.

* * * * *